US009698173B2

(12) United States Patent
Wei et al.

(10) Patent No.: US 9,698,173 B2
(45) Date of Patent: Jul. 4, 2017

(54) THIN FILM TRANSISTOR, DISPLAY, AND METHOD FOR FABRICATING THE SAME

(71) Applicant: ROYOLE CORPORATION, Fremont, CA (US)

(72) Inventors: Peng Wei, Fremont, CA (US); Xiaojun Yu, Fremont, CA (US); Ze Yuan, Fremont, CA (US); Jigang Zhao, Fremont, CA (US); Haojun Luo, Fremont, CA (US); Zihong Liu, Fremont, CA (US)

(73) Assignee: ROYOLE CORPORATION, Fremont, CA (US)

( * ) Notice: Subject to any disclaimer, the term of this patent is extended or adjusted under 35 U.S.C. 154(b) by 0 days.

(21) Appl. No.: 14/593,812

(22) Filed: Jan. 9, 2015

(65) Prior Publication Data

US 2016/0056184 A1 Feb. 25, 2016

Related U.S. Application Data

(60) Provisional application No. 62/041,129, filed on Aug. 24, 2014.

(51) Int. Cl.

| *H01L 27/12* | (2006.01) |
|---|---|
| *H01L 49/02* | (2006.01) |
| *H01L 29/786* | (2006.01) |
| *H01L 21/283* | (2006.01) |
| *H01L 21/441* | (2006.01) |
| *H01L 27/32* | (2006.01) |

(52) U.S. Cl.
CPC ........ *H01L 27/1255* (2013.01); *H01L 21/283* (2013.01); *H01L 21/441* (2013.01);
(Continued)

(58) Field of Classification Search
CPC . H01L 27/1255; H01L 21/283; H01L 21/441; H01L 27/124; H01L 27/1288; H01L 28/60; H01L 29/78669
(Continued)

(56) References Cited

U.S. PATENT DOCUMENTS 5,994,157 A * 11/1999 Aggas ............... H01L 27/14658
257/E27.131
7,737,517 B2 * 6/2010 Kawamura ......... H01L 27/1225
257/432

(Continued)

FOREIGN PATENT DOCUMENTS

| CN | 102646699 A | 8/2012 |
|---|---|---|
| CN | 102709327 A | 10/2012 |

*Primary Examiner* — Ori Nadav
(74) *Attorney, Agent, or Firm* — Morgan, Lewis & Bockius LLP

(57) ABSTRACT

A thin film transistor (TFT) device is provided. The TFT device includes a first conductive layer including a gate electrode and a connection pad. The TFT device further includes a first dielectric layer covering the gate electrode, and a semiconductor layer disposed on the dielectric layer and overlapping the gate electrode. The TFT device further includes a second dielectric layer disposed on the semiconductor layer and the first dielectric layer so as to expose first and second portions of the semiconductor layer and the connection pad. The TFT device further includes a second conductive layer which includes a source electrode portion covering the first portion of the semiconductor layer; a pixel electrode portion extending to the source electrode portion; a drain electrode portion covering the second portion of the semiconductor layer; and an interconnection portion disposed on the connection pad and extending to the drain electrode portion.

17 Claims, 19 Drawing Sheets

(52) U.S. Cl.
CPC ........ *H01L 27/124* (2013.01); *H01L 27/1288* (2013.01); *H01L 28/60* (2013.01); *H01L 29/78669* (2013.01); *H01L 29/78678* (2013.01); *H01L 29/78684* (2013.01); *H01L 27/3248* (2013.01); *H01L 27/3276* (2013.01); *H01L 2227/323* (2013.01)

(58) Field of Classification Search
USPC ........................................ 257/43, 57, 59, 72
See application file for complete search history.

(56) References Cited

U.S. PATENT DOCUMENTS

| | | | | |
|---|---|---|---|---|
| 7,745,830 B2 * | 6/2010 | Gu | .................... | G02F 1/136213 257/72 |
| 8,319,225 B2 * | 11/2012 | Kamo | ................. | H01L 27/1214 257/72 |
| 8,598,577 B2 * | 12/2013 | Park | .................... | H01L 27/1214 257/43 |
| 8,878,185 B2 * | 11/2014 | Ishigaki | ................. | H01L 33/08 257/40 |
| 8,941,114 B2 * | 1/2015 | Yamazaki | ..................... | 257/347 |
| 2006/0091785 A1 * | 5/2006 | Lee | .................... | H01L 27/3262 313/498 |
| 2009/0189155 A1 * | 7/2009 | Akimoto | ........... | H01L 29/41733 257/43 |
| 2013/0020571 A1 | 1/2013 | Yamazaki et al. | | |
| 2013/0234117 A1 * | 9/2013 | Kim | .................... | H01L 51/5218 257/40 |
| 2014/0061633 A1 | 3/2014 | Wang et al. | | |

\* cited by examiner

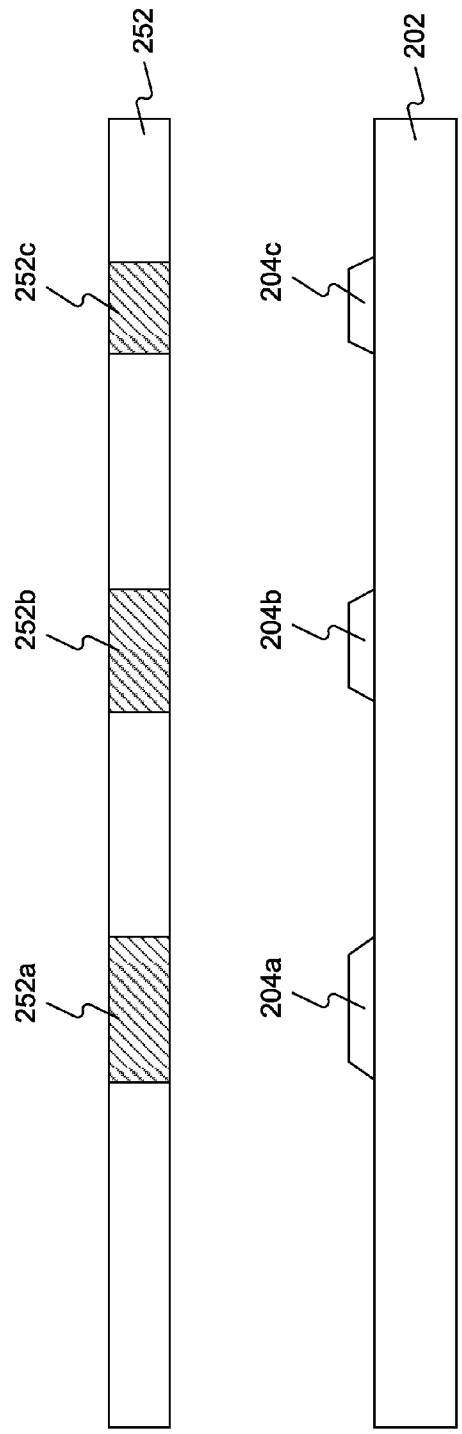
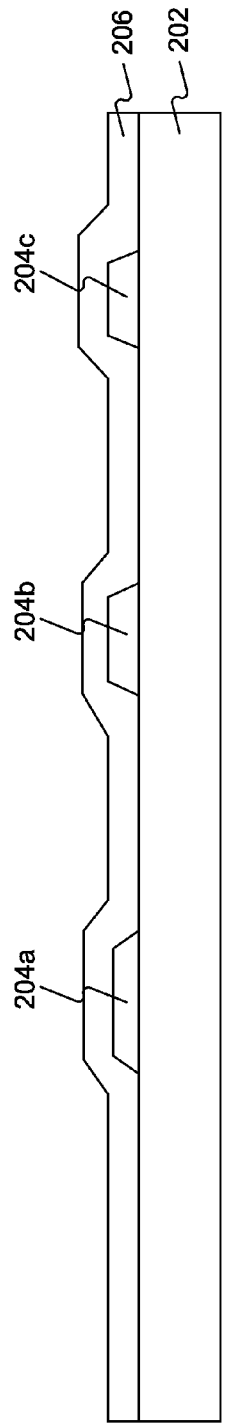
Fig. 5C
Fig. 5D

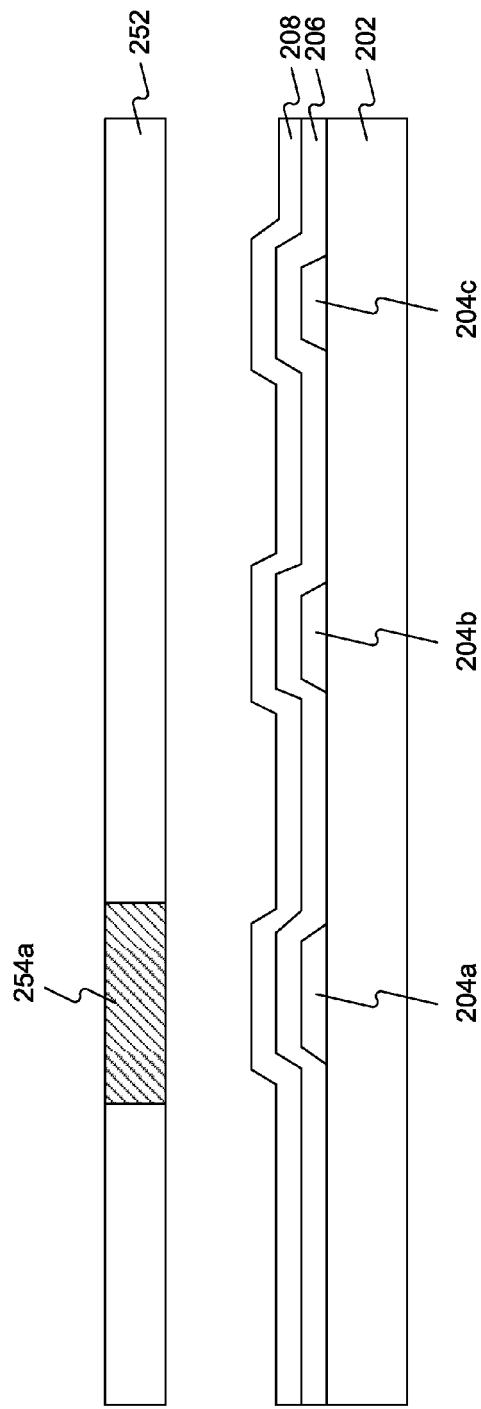
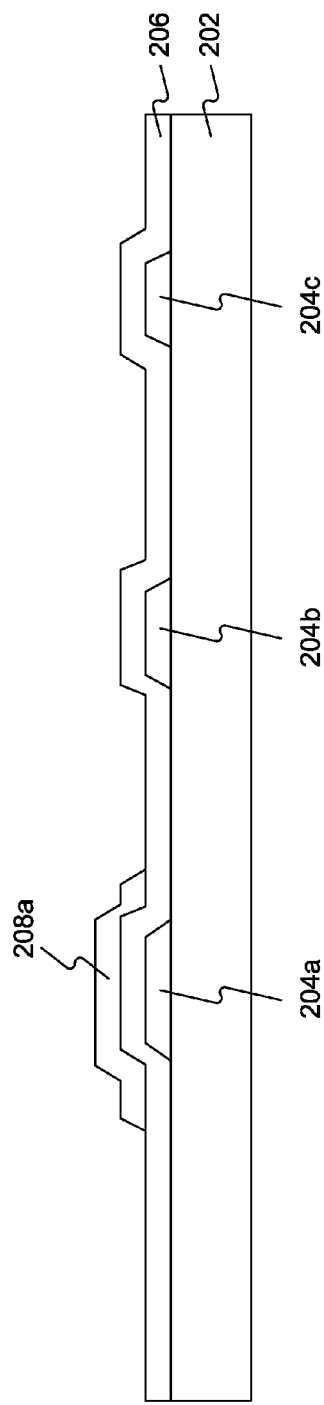
Fig. 5E
Fig. 5F

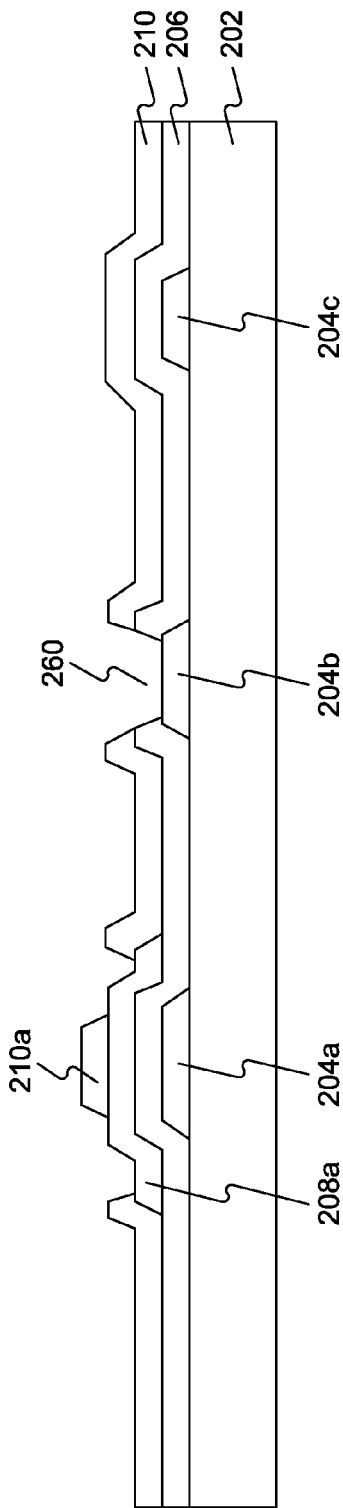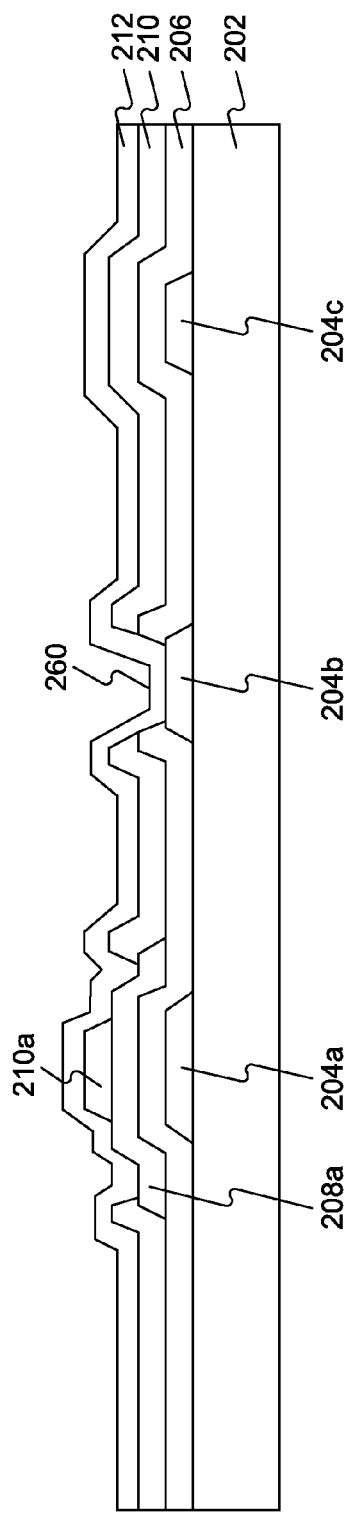

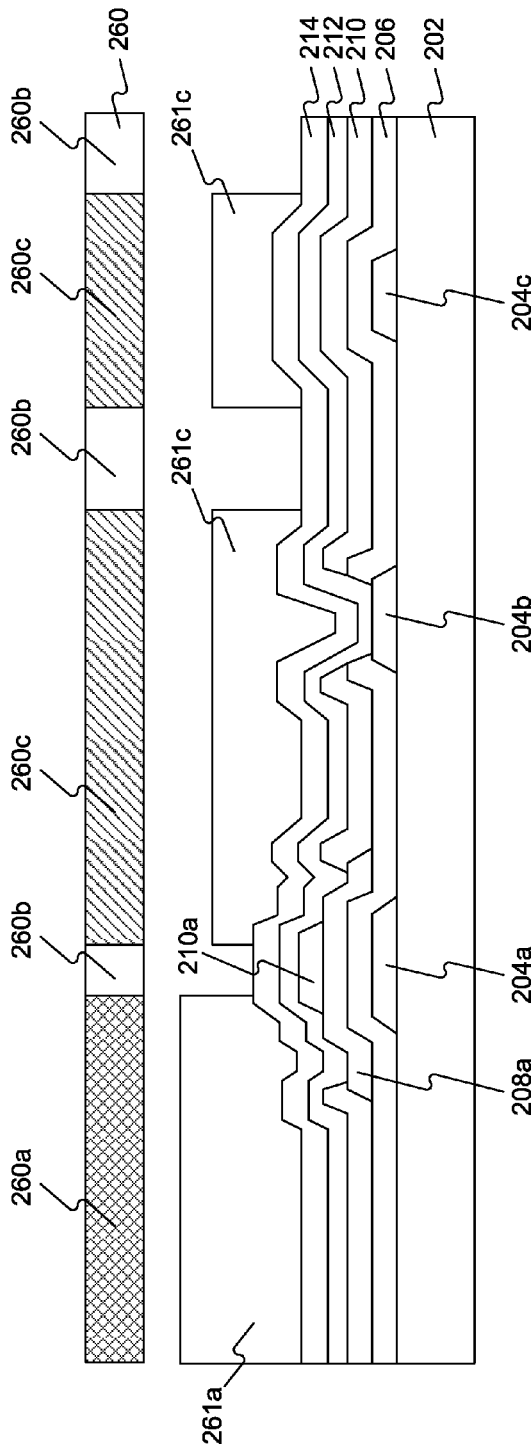
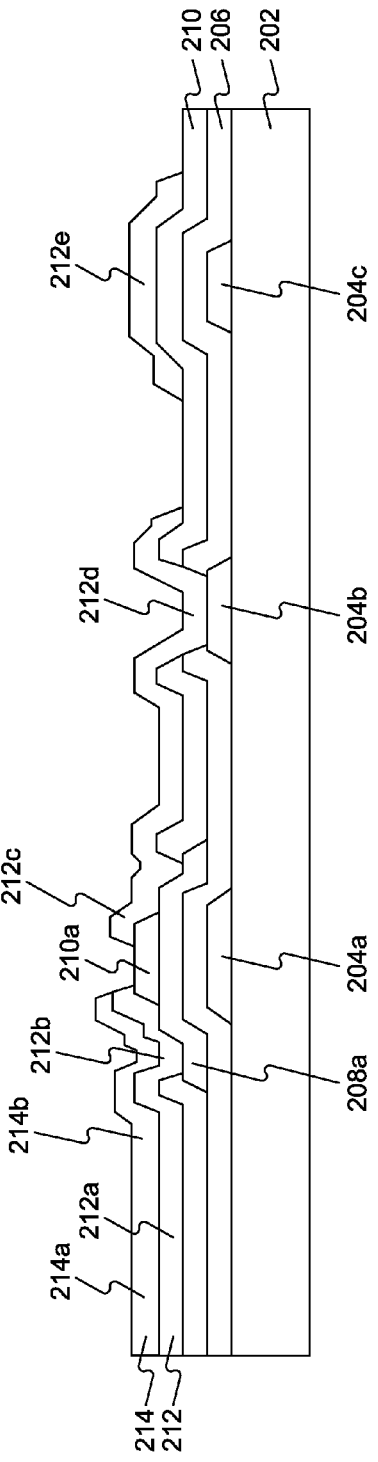
Fig. 6C
Fig. 6D

THIN FILM TRANSISTOR, DISPLAY, AND METHOD FOR FABRICATING THE SAME

CROSS-REFERENCE TO RELATED APPLICATION

This application claims priority to provisional application No. 62/041,129, entitled "Thin Film Transistor and Method for Fabricating the Same," filed on Aug. 24, 2014, the content of which is incorporated herein by reference.

TECHNICAL FIELD

Exemplary embodiments relate to a transistor, and in particular, to a thin-film transistor and its application in a display, and a method for manufacturing the same.

BACKGROUND

Flat panel displays have been in the market in the applications such as, TVs, monitors, cell phones, small phones, personal digital assistants (PDAs), etc. Particularly, due to its capability of being in large size and high definition, active matrix flat panel displays are widely integrated in large-sized TVs and high-definition hand-held devices.

An active matrix flat panel display generally includes an array of thin-film transistors (TFT) to control a light emission device. An exemplary TFT device 100 is shown in FIG. 1. Referring to FIG. 1, TFT device 100 includes a substrate 102, a gate electrode 104 disposed on substrate 102, a dielectric layer 106 disposed on substrate 102 and gate electrode 104, a semiconductor layer 108 disposed on dielectric layer 106, an etching stop 110 disposed on semiconductor layer 108, a drain electrode 112 disposed on one side of and in contact with semiconductor layer 108, a source electrode 114 disposed on another side of and in contact with semiconductor layer 108, a passivation layer 116 disposed on top of the above layers, a first contact hole 118 formed in passivation layer 116 to reach source electrode 114, a second contact hole 120 formed in passivation layer 116 to reach drain electrode 112, a pixel electrode 122 disposed in first contact hole 118, and a data electrode 124 disposed in second contact hole 120.

To form the TFT device as shown in FIG. 1, at least six masks are employed to form the pattern of the device layers. Specifically, one mask is needed for each of gate electrode 104, semiconductor layer 108, etch stop 110, source electrode 114 and drain electrode 112, contact holes 118, 120, and pixel electrode 122.

Etch stop 110 is employed to protect semiconductor layer 108 from being damaged by etchants during the patterning and etching steps to form source and drain electrodes 114, 112. This structure requires an extra photo mask to pattern etch stop 110 itself, which increases the fabrication cost and decreases the processing throughput. Further, passivation layer 116 is employed to protect the underlying device layers 104 through 114 from being affected by the environment.

Therefore, there is a need to reduce the number of the masks employed to fabricate a TFT device to increase manufacturing throughput and decrease the cost.

SUMMARY OF EMBODIMENTS

Consistent with this disclosure, a thin film transistor (TFT) device is provided. The TFT device includes a first conductive layer including a gate electrode, and a connection pad. The TFT device further includes a first dielectric layer covering the gate electrode. The connection pad is exposed from the first dielectric layer. The TFT device further includes a semiconductor layer disposed on the dielectric layer and overlapping the gate electrode. The TFT device further includes a second dielectric layer disposed on the semiconductor layer and the first dielectric layer so as to expose first and second portions of the semiconductor layer and the connection pad. The TFT device further includes a second conductive layer which includes a source electrode portion covering the first portion of the semiconductor layer; a pixel electrode portion extending to the source electrode portion; a drain electrode portion covering the second portion of the semiconductor layer; and an interconnection portion disposed on the connection pad and extending to the drain electrode portion.

Consistent with this disclosure, a method for forming a thin film transistor device is provided. The method includes depositing a first conductive layer on a substrate; patterning the first conductive layer with a first mask to form a gate electrode, and a connection pad; depositing a first dielectric layer over the substrate to cover the gate electrode, and the connection pad; depositing a semiconductor layer on the first dielectric layer; patterning the semiconductor layer with a second mask to form a semiconductor island to overlap the gate electrode; and depositing a second dielectric layer on the substrate. The method further includes patterning the second dielectric layer with a third mask to expose first and second portions of the semiconductor island and forming a dielectric island on the semiconductor island, and patterning the second dielectric layer and the first dielectric layer with the third mask to expose the connection pad; depositing a second conductive layer on the substrate so that the second conductive layer is in contact with the connection pad; and patterning second conductive layer with a fourth mask.

BRIEF DESCRIPTION OF THE DRAWINGS

Reference will now be made, by way of example, to the accompanying drawings which show conventional and exemplary embodiments of the present application, and in which:

FIGS. 5A-5K depict exemplary methods of forming TFT devices consistent with some embodiments of this disclosure;

FIGS. 6A-6D depict exemplary methods of forming TFT devices consistent with some embodiments of this disclosure;

DESCRIPTION OF EXAMPLE EMBODIMENTS

Hereinafter, embodiments consistent with the disclosure will be described with reference to the drawings.

Figure 2:
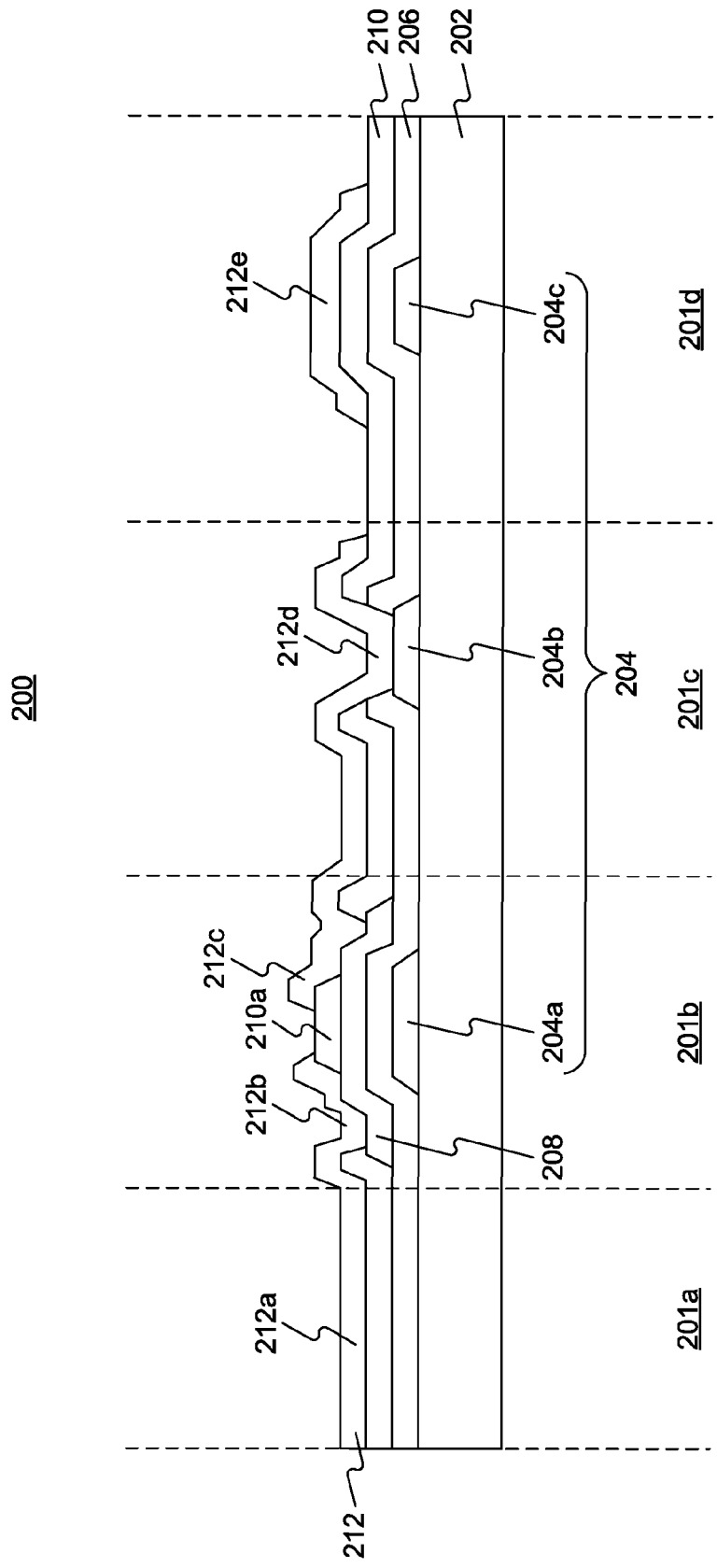
FIG. 2 shows a TFT device consistent with some embodiments of this disclosure.

FIG. 2 depicts an exemplary TFT device 200. TFT device 200 may be employed in a liquid crystal display, an organic light-emitting-diode (OLED) device, or other electronic devices. TFT device 200 includes a light-emitting region 201a, a TFT device region 201b, an interconnection region 201c, and a storage capacitor region 201d formed on a substrate 202. Substrate 202 may be made of glass, silicon, stainless steel, or polymer, or any combination of the above materials. The polymer substrate may be made of polyimide (PI), polyethylene naphthalate (PEN), polyethylene terephthalate (PET), polystyrene (PS), polyethersulfone (PES), polyethylene (PE), polyvinyl chloride (PVC), etc.

TFT device 200 includes a first conductive layer 204 formed on substrate 202, a first dielectric layer 206, a semiconductor layer 208, a second dielectric layer 210, and a second conductive layer 212. In some embodiments, a buffer or barrier layer is formed on substrate 202 before depositing first conductive layer 204 on substrate 202.

First conductive layer 204 includes a gate electrode 204a for TFT device region 201b, a connection pad 204b for interconnection region 201c, and a first electrode 204c for capacitor region 201d. First conductive layer 204 may be a metal (Al, Cu, Mo, Ti, Ni, W, Au, Pd, Pt, Cr, Nd, Zn, Co, Mn, or Ag), a conducting metal oxide (an oxide of zinc (Zn), indium (In), tin (Sn), gallium (Ga), hafnium (Hf), aluminum (Al), arsenic (As), cadmium (Cd), mercury (Hg), thallium (TI), lead (Pb), silver (Ag), gold (Au), germanium (Ge), antimony (Sb), bismuth (Bi), hafnium (Hf), or zirconium (Zr), etc., such as ITO, IZO, AZO, GZO, $In_2O_3$, or ZnO), or the mixture or multilayers or any combination of the above materials.

First dielectric layer 206 covers gate electrode 204a and first electrode 204c, but does not completely cover connection pad 204b so as to expose at least a portion of connection pad 204b from first dielectric layer 206. First dielectric layer 206 may be made of $SiO_x$, $SiN_x$, $SiO_xN_y$, $AlO_x$, $Y_2O_3$, $HfO_x$, $ZrO_x$, AlN, AlNO, $TiO_x$, $BaTiO_3$, $PbTiO_3$, polymer, spin-on-glass (SOG), spin-on-dielectric (SOD), etc. or the mixture or multilayers or combination of the above materials.

Semiconductor layer 208 is formed on dielectric layer 206 and is disposed to overlap gate electrode 204a. In some embodiments, semiconductor layer 208 may be an island and have a width greater than that of gate electrode 204a. Semiconductor layer 208 may be made of amorphous silicon (a-Si), polysilicon, or metal oxide, such as oxides of zinc (Zn), indium (In), tin (Sn), gallium (Ga), hafnium (Hf), aluminum (Al), arsenic (As), cadmium (Cd), mercury (Hg), thallium (TI), lead (Pb), silver (Ag), gold (Au), germanium (Ge), antimony (Sb), bismuth (Bi), hafnium (Hf), or zirconium (Zr), etc. or combination of the above elements.

Second dielectric layer 210 is disposed on semiconductor layer 208 and first dielectric layer 206. Second dielectric layer 210 includes a dielectric island 210a that overlaps a portion of semiconductor layer 208. Second dielectric layer 210 has openings to expose connection pad 204b and first and second portions of semiconductor layer 208 on two sides of dielectric island 210a. Referring to FIG. 2, a portion of second dielectric layer 210 is further disposed to cover first electrode 204c. In some embodiments, one of first dielectric layer 206 or second dielectric layer 210 on first electrode 204c may be omitted. Second dielectric layer 210 may be made of $SiO_x$, $SiN_x$, $SiO_xN_y$, $AlO_x$, $Y_2O_3$, $HfO_x$, $ZrO_x$, AlN, AlNO, $TiO_x$, $BaTiO_3$, $PbTiO_3$, polymer, SOG, SOD, etc. or the mixture or multilayers or combination of the above materials.

Referring to FIG. 2, second conductive layer 212 is disposed on substrate 202. Second conductive layer 212 includes a pixel electrode portion 212a on second dielectric layer 210, a source electrode portion 212b disposed on and covering one exposed surface of semiconductor layer 208 to form the source electrode contact, a drain electrode portion 212c disposed on and covering another exposed surface of semiconductor layer 208 to form the drain electrode contact, an interconnection portion 212d disposed on connection pad 204b, and a second electrode 212e disposed in capacitor region 201d. As shown in FIG. 2, pixel electrode portion 212a extends to source electrode portion 212b. Similarly, interconnection portion 212d extends to drain electrode portion 212c. Second electrode 212e, first electrode 204c, and first and second dielectric layers form a capacitor.

In some embodiments, second conductive layer 212 can be a metal layer having a material selected from Al, Cu, Mo, Ti, Ni, W, Au, Pd, Pt, Cr, Nd, Zn, Co, Mn, Ag, etc., or the mixture or multilayer or combination of the above materials. In other embodiments, second conductive layer 212 can be a transparent conductor having a metal oxide material selected from oxides of In, Zn, Sn, Ga, Al, As, Cd, Hg, Tl, Pb, Ag, Au, Ge, Sb, Bi, Hf, Zr, etc., such as ITO, IZO, AZO, GZO, $In_2O_3$, ZnO, etc., or the mixture or multilayer or combination of the above materials. In some embodiments, second conductive layer 212 may include a mixture of metal and metal oxide. For example, second conductive layer 212 can include one metal material (e.g., Zn) and one metal oxide material (e.g., ZnO) selected from the above materials.

Figure 3:
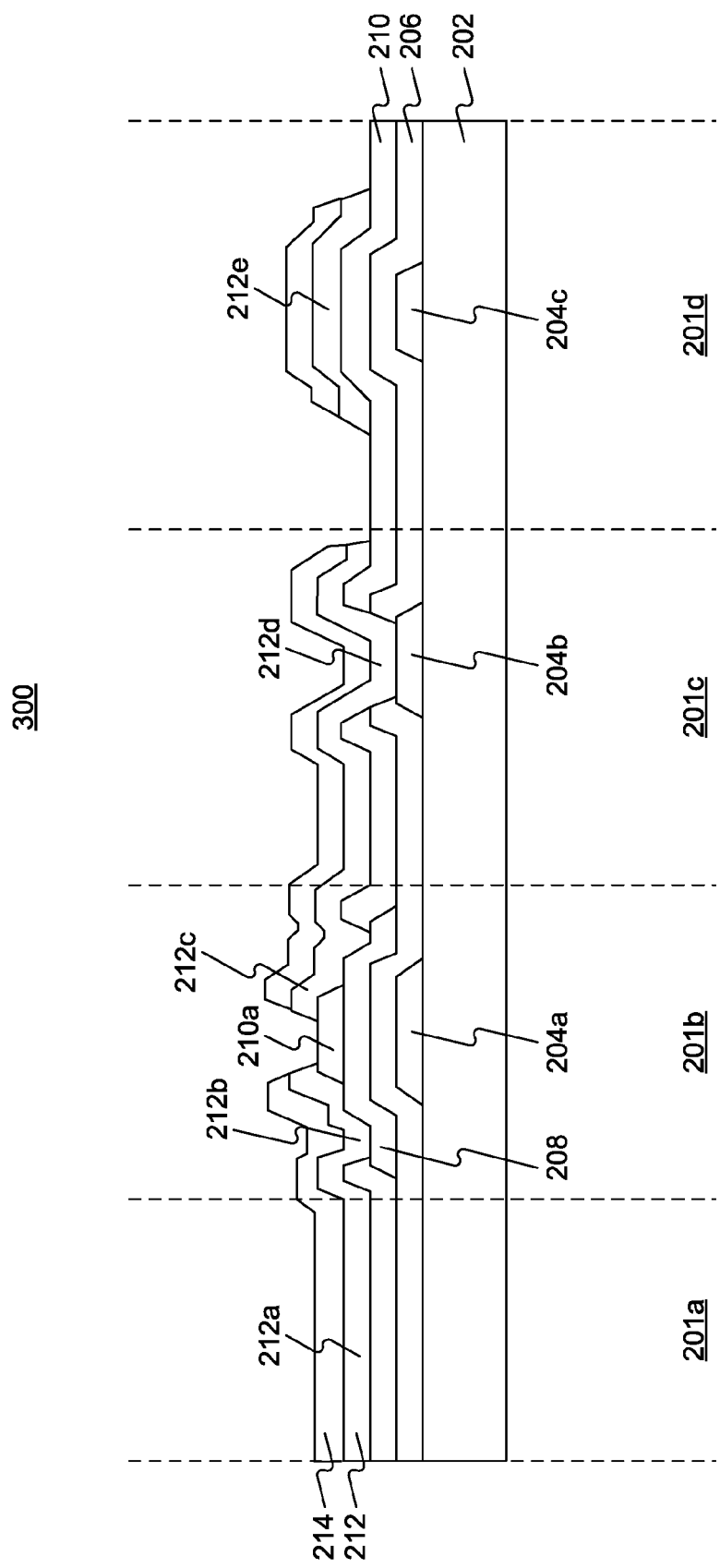
FIG. 3 shows another TFT device consistent with some embodiments of this disclosure.

Furthermore, in some embodiments, a TFT device may include a third conductive layer 214 disposed on second conductive layer 212. For example, an exemplary TFT device 300 is shown FIG. 3. Referring to FIG. 3, third conductive layer 214 is disposed to cover second conductive layer 212 so that they are in alignment with each other. This third conductive layer 214 could be selected from a material to achieve a better surface smoothness and better work function match with a top layer, such as an OLED layer in pixel electrode region. Third conductive layer 214 may contain a material different from second conductive layer 212. In some embodiments, second conductive layer 212 and third conductive layer 214 includes reflective materials (e.g., metal) and transparent conductors (e.g., metal oxide), respectively. For example, second conductive layer 212 can be made of a metal material selected from Al, Cu, Mo, Ti, Ni, W, Au, Pd, Pt, Cr, Nd, Zn, Co, Mn, Ag, etc., or the mixture or multilayer or combination of the above materials. Third conductive layer 214 is made of a metal oxide material selected from oxides of In, Zn, Sn, Ga, Al, As, Cd, Hg, Tl, Pb, Ag, Au, Ge, Sb, Bi, Hf, Zr, etc., such as ITO, IZO, AZO, GZO, $In_2O_3$, ZnO, etc., or the mixture or multilayer or combination of the above materials. Metal oxide material has better surface smoothness and matching work function with OLED layers. Other structures and materials shown in FIG. 3 are similar to those described in connection with FIG. 2, and thus the corresponding descriptions are omitted.

Figure 4:
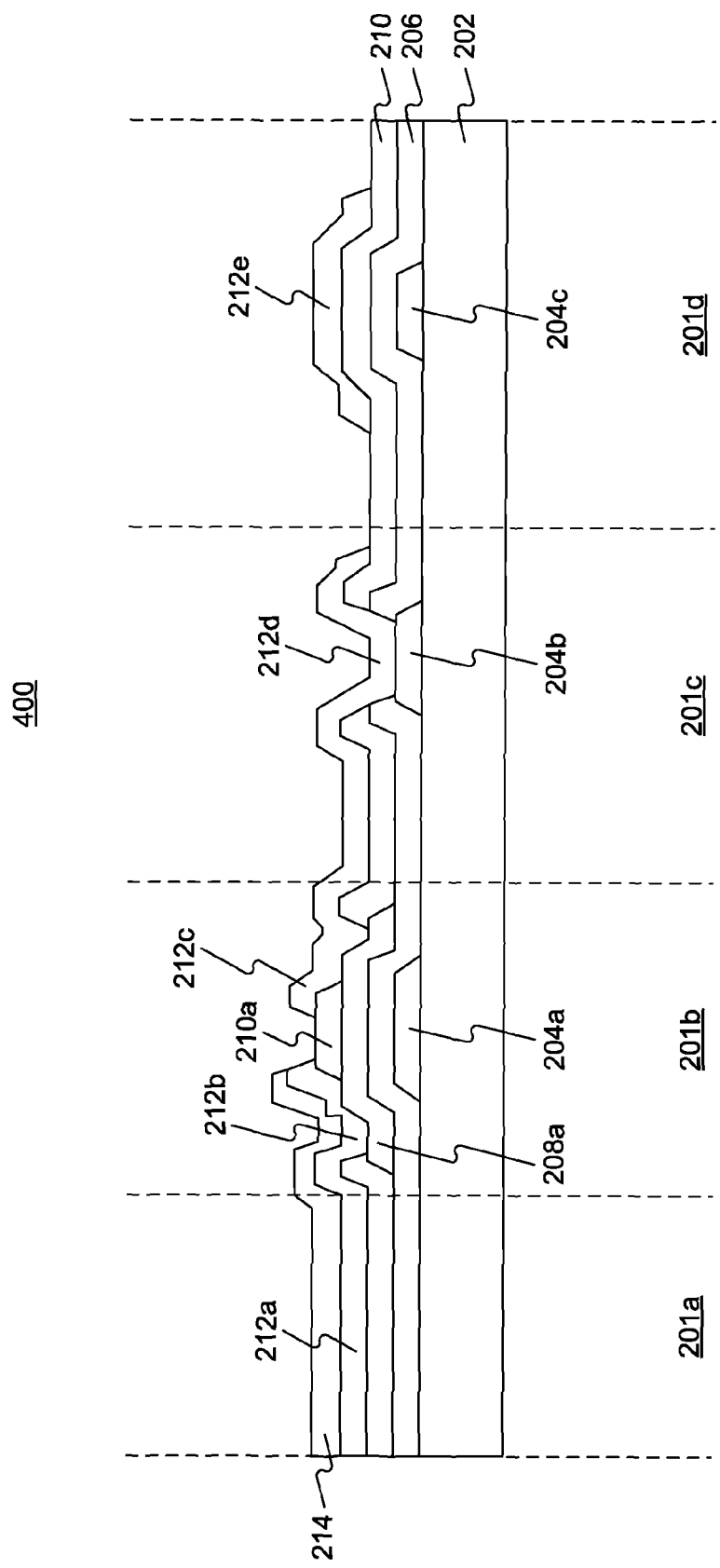
FIG. 4 shows yet another TFT device consistent with some embodiments of this disclosure.

In some embodiments, third conductive layer 214 may be disposed on a portion of second conductive layer 212, but is not completely aligned with second conductive layer 212. An example of such TFT device 400 is shown in FIG. 4. Referring to FIG. 4, third conductive layer 214 is disposed on and aligned with pixel electrode portion 212a and source electrode portion 212b of second conductive layer 212, but is not disposed on drain electrode portion 212c, interconnection portion 212d, and second electrode portion 212e. However, the structure of third conductive layer 214 is not limited to the configuration of FIG. 4. For example, third conductive layer 214 may be disposed on and aligned with pixel electrode portion 212a of second conductive layer 212, but is not disposed on other portions of second conductive layer 212. Other structures and materials shown in FIG. 4 are similar to those described in connection with FIG. 2, and thus the corresponding descriptions are omitted.

Figure 5A:
Figure 5B:
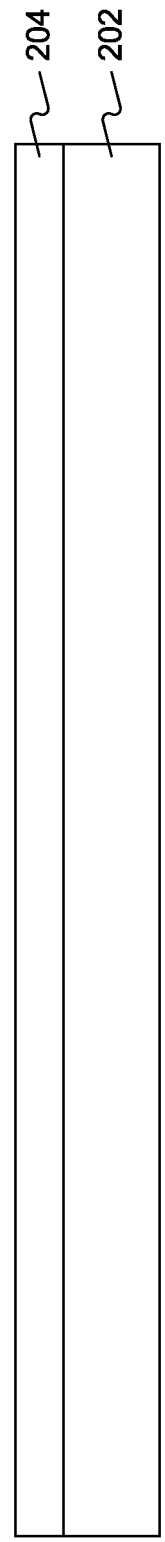

Next, methods for forming TFT devices are described below. Referring to FIG. 5A, a substrate 202 is provided. Substrate 202 may be made of glass, silicon, stainless steel, or polymer. The polymer substrate may be made of polyimide (PI), polyethylene naphthalate (PEN), polyethylene terephthalate (PET), polystyrene (PS), polyethersulfone (PES), polyethylene (PE), polyvinyl chloride (PVC), etc. A first conductive layer 204 is then formed on substrate 202, as shown in FIG. 5B. First conductive layer 204 may include a metal (Al, Cu, Mo, Ti, Ni, W, Au, Pd, Pt, Cr, Nd, Zn, Co, Mn, or Ag), a conducting metal oxide (a metal oxide material selected from oxides of In, Zn, Sn, Ga, Al, As, Cd, Hg, Tl, Pb, Ag, Au, Ge, Sb, Bi, Hf, Zr, etc., such as ITO, IZO, AZO, GZO, $In_2O_3$, or ZnO), or the mixture or multilayers or any combination of the above materials. First conductive layer 204 may be formed on substrate 202 by various deposition techniques, such as chemical vapor deposition (CVD), plasma-enhanced CVD (PECVD), atomic layer deposition (ALD), sputtering, evaporation, or solution coating and curing.

Referring to FIG. 5C, first conductive layer 204 is then patterned with a first mask 252 to form a gate electrode 204a, a connection pad 204b, and a first electrode 204c using a photolithographic process. A detailed description of a photolithographic process in this disclosure, which includes the steps of coating a photoresist on a layer, exposing the photoresist, developing the photoresist, and etching the layer with the patterned photoresist, is disclosed in FIGS. 5G, 5H, 5I and related text, and will be omitted here. First mask 252 may include patterns 252a, 252b, and 252c for the photolithographic process. A first dielectric layer 206 is subsequently formed on substrate 202 and gate electrode 204a, connection pad 204b, and first electrode 204c of first conductive layer 204 as shown in FIG. 5D. First dielectric layer 206 may be formed on substrate 202 by various deposition techniques, such as CVD, PECVD, ALD, sputtering, evaporation, or solution coating and curing. The material of first dielectric layer 206 may include $SiO_x$, $SiN_x$, $SiO_xN_y$, $AlO_x$, $Y_2O_3$, $HfO_x$, $ZrO_x$, AlN, AlNO, $TiO_x$, $BaTiO_3$, $PbTiO_3$, polymer, SOG, SOD etc. or the mixture or multilayers or combination of the above materials.

Referring to FIG. 5E, a semiconductor layer 208 is formed on first dielectric layer 206 by various deposition techniques as discussed above. Semiconductor layer 208 may be made of amorphous silicon (a-Si), polysilicon, or a metal oxide, such as an oxide of In, Zn, Sn, Ga, Al, As, Cd, Hg, Tl, Pb, Ag, Au, Ge, Sb, Bi, Hf, Zr, etc. Semiconductor layer 208 is then pattern with a second mask 254 to form a semiconductor island 208a using a photolithographic process as shown in FIG. 5F. Second mask 254 may include patterns (e.g., 254a) for the photolithographic process.

Figure 5G:
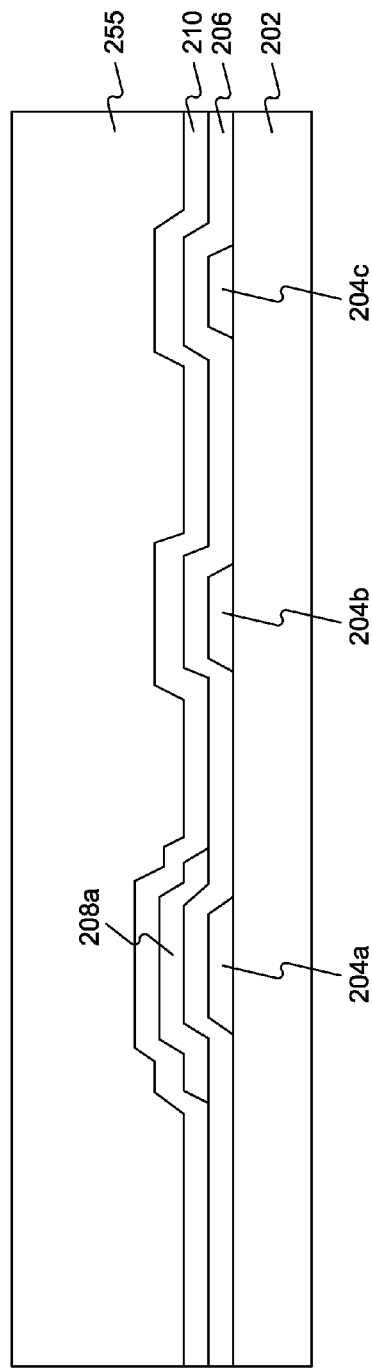
Figure 5H:
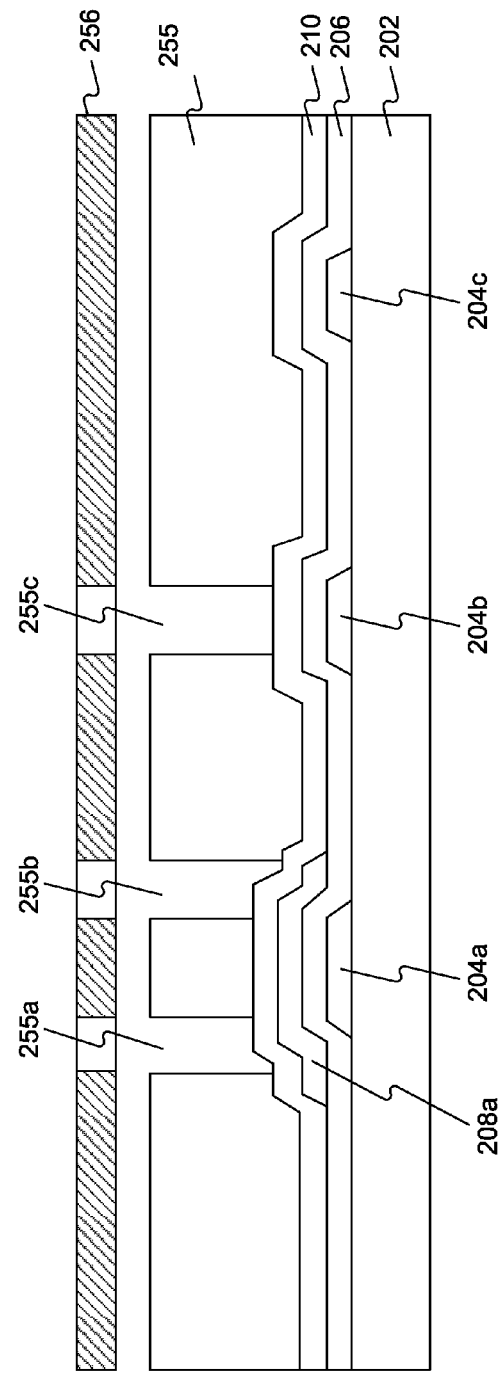

Referring to FIG. 5G, a second dielectric layer 210 is then formed to cover semiconductor island 208a and first dielectric layer 206. Second dielectric layer 210 may be formed by various deposition techniques, such as CVD, PECVD, ALD, sputtering, evaporation, or solution coating and curing. The material of second dielectric layer 210 may include $SiO_x$, $SiN_x$, $SiO_xN_y$, $AlO_x$, $Y_2O_3$, $HfO_x$, $ZrO_x$, AlN, AlNO, $TiO_x$, $BaTiO_3$, $PbTiO_3$, polymer, SOG, SOD, etc. or the mixture or multilayers or combination of the above materials. Referring to FIGS. 5G and 5H, a photoresist 255 is formed on second dielectric layer 210 to facilitate patterning second dialectic layer 210. Referring to FIG. 5H, second dielectric layer 210 is then patterned through photoresist 255 with a third mask 256. For example, photoresist 255 is exposed with light through third mask 256 and developed to form openings 255a-255c. Specifically, openings 255a-255c are formed in photoresist 255 at predetermined locations using third mask 256. For example, openings 255a-255c may be formed on top of semiconductor island 208a and connection pad 204b as shown in FIG. 5H. Second dielectric layer 210 is then patterned through photoresist 255 having openings 255a-255c. For example, referring to FIG. 5I, second dielectric layer 210 is patterned by an etching process to remove materials of second dielectric layer 210 at openings 255a-255c so as to form a dielectric island 210a over semiconductor island 208a and to expose first and second portions of semiconductor island 208a to form source/drain electrode contact. The exposed portions of semiconductor island 208a can be source and drain regions for a TFT. Further, the etching process also exposes a portion of connection pad 204b by removing a portion of second dielectric layer 210 and first dielectric layer 206 to make an opening 260 on connection pad 204b. The etching process can be a wet or dry etching, or a combination of both. The etchant of 2nd dielectric layer may be selected to have good etching selectivity on the semiconductor layer to further etch the first dielectric layer 206 without damaging the semiconductor layer.

In some embodiments, because the materials in semiconductor island 208a may be resistant to etching solutions of a wet process or etching gases of a dry process, after removing a portion of second dielectric layer 210, the etching process can continue to remove a portion of first dielectric layer 206 on connection pad 204a while portions of semiconductor island 208a are exposed to the etching solutions or etching gases. For example, metal oxide has good selectivity (resistance) against etching gases $CH_xF_y$/$O_2$, and can be the material of semiconductor island 208a when $SiO_x$ is employed for the material of first and second dielectric layers 206, 210.

Next, referring to FIG. 5J, a second conductive layer 212 is formed on substrate 202 to cover second dielectric layer 210 and the exposed portions of semiconductor island 208a and exposed portion of connection pad 204b. Second conductive layer 212 may include a metal (Al, Cu, Mo, Ti, Ni, W, Au, Pd, Pt, Cr, Nd, Zn, Co, Mn, or Ag), a conducting metal oxide (an oxide of In, Zn, Sn, Ga, Al, As, Cd, Hg, Tl, Pb, Ag, Au, Ge, Sb, Bi, Hf, Zr, etc., such as ITO, IZO, AZO, GZO, $In_2O_3$, or ZnO), or any combination of the above materials. Second conductive layer 212 may be formed by various deposition techniques, such as CVD, PECVD, ALD, sputtering, evaporation, or solution coating and curing. In some embodiments, for example, as applied in bottom-emission active-matrix OLED (AMOLED) devices, the materials for second conductive layer 212 may be transparent. Exemplary transparent conductive materials may include a conductive metal oxide of In, Zn, Sn, Ga, Al, As, Cd, Hg, Tl, Pb, Ag, Au, Ge, Sb, Bi, Hf, Zr, such as ITO, IZO, AZO, GZO, $In_2O_3$, or ZnO, or any combination of those materials. In other embodiments, for example, as applied in top-emission AMOLED devices, the materials for second conductive layer 212 may be reflective. Exemplary reflective conductive materials may include metals, e.g., Al, Cu, Mo, Ti, Ni, W, Au, Pd, Pt, Cr, Nd, Zn, Co, Mn, or Ag, or any combination of those materials.

Figure 5K:
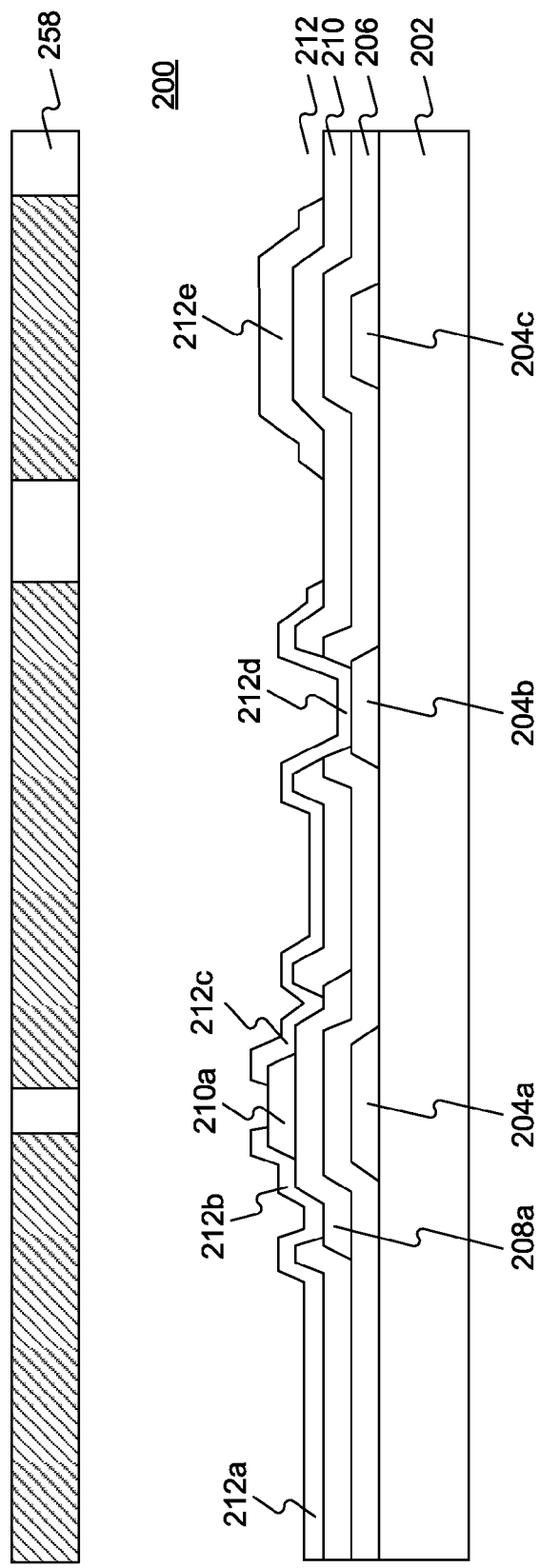

Referring to FIG. 5K, second conductive layer 212 is then patterned with a fourth mask 258 to form a pixel electrode portion 212a on second dielectric layer 210, a source electrode portion 212b disposed on and covering one exposed portion of semiconductor island 208a, a drain electrode portion 212c disposed on and covering another exposed portion of semiconductor island 208a, an interconnection portion 212d disposed on connection pad 204b, and a second electrode 212e opposed to first electrode 204c. Pixel electrode portion 212a extends to and connects source electrode portion 212b. Interconnection portion 212d extends to and connects drain electrode portion 212c. However, the arrangements of these portions are not limited to these configurations. For example, in some embodiments, interconnection portion 212d and drain electrode portion 212c may be separated from each other or coupled to each other through another wiring pattern (not shown).

Figure 1:
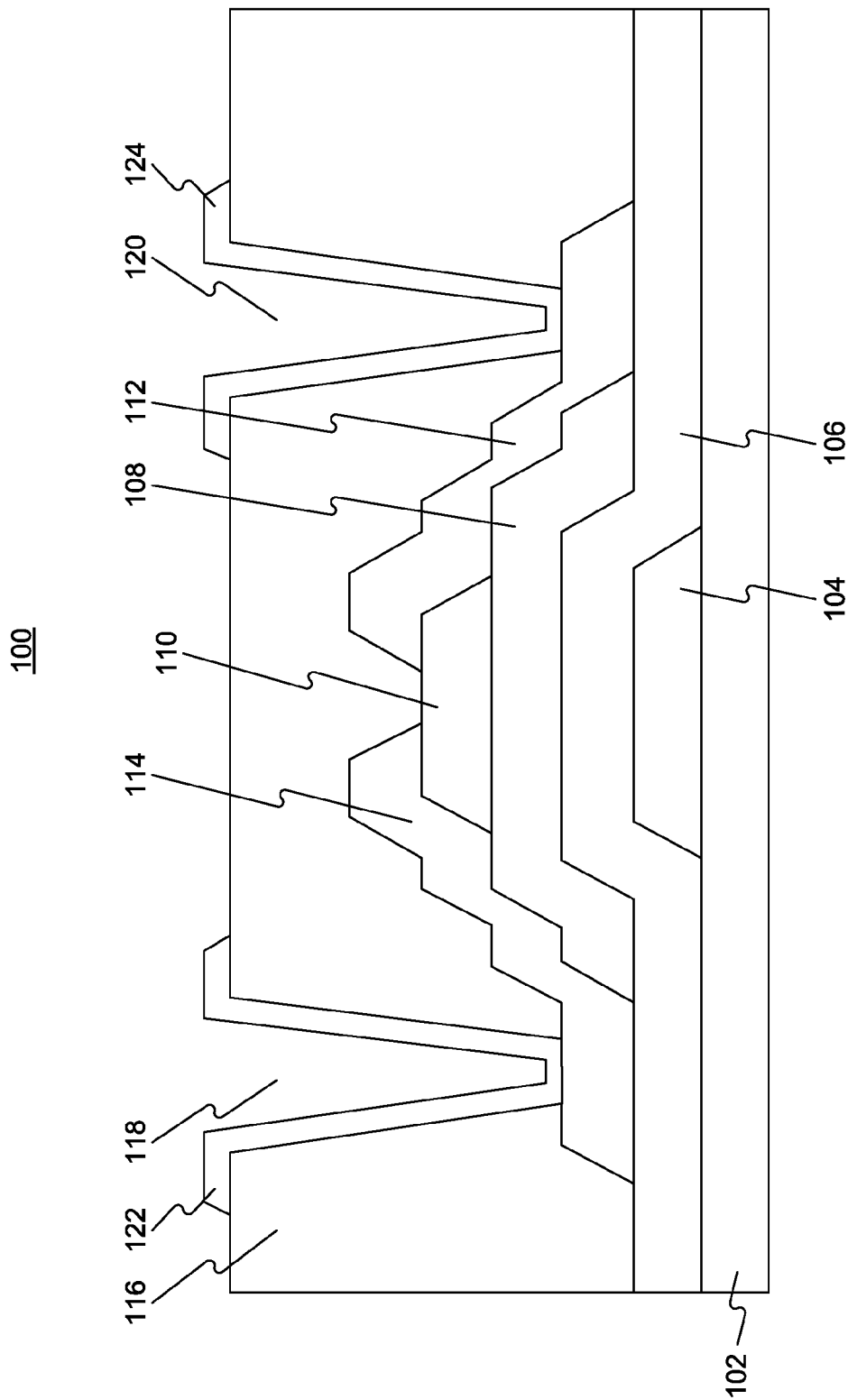
FIG. 1 shows a conventional TFT device.

As described above with FIGS. 5A-5K, TFT device 200 may be formed with four masks so that the manufacturing cost may be reduced. Further, dielectric island 210a and opening 260 leading to connection pad 204b (FIG. 5I) may be formed in the same etching step to reduce processing time and increase throughput. As described above in connection with FIG. 5K, the same conductive layer 212 may be employed for a pixel electrode, source and drain electrodes, interconnection, and an electrode for a capacitor, which may further reduce the processing steps. Also, as compared to the device shown in FIG. 1, the passivation layer 116 of FIG. 1 may be omitted to further reduce cost.

Figure 6A:
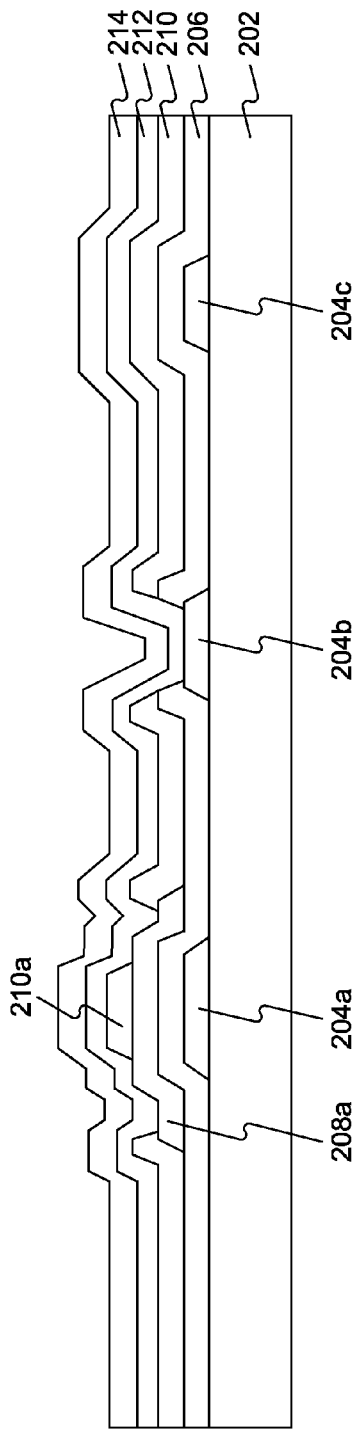

In some embodiments, after second conductive layer 212 is formed on substrate 202 and before it is patterned as shown in FIG. 5J, a third conductive layer 214 may be formed on second conductive layer 212. An example is depicted in FIG. 6A. Third conductive layer 214 may be formed on second conductive layer 212 by various deposition techniques, such as CVD, PECVD, ALD, sputtering, evaporation, or solution coating and curing. Third conductive layer 214 may include a metal (Al, Cu, Mo, Ti, Ni, W, Au, Pd, Pt, Cr, Nd, Zn, Co, Mn, or Ag), a conducting metal oxide (an oxide of In, Zn, Sn, Ga, Al, As, Cd, Hg, Tl, Pb, Ag, Au, Ge, Sb, Bi, Hf, Zr, etc., such as ITO, IZO, AZO, GZO, $In_2O_3$, or ZnO), or any mixture or combination of the above materials.

In some embodiments, third conductive layer 214 includes a material different from that of second conductive layer 212. For example, third conductive layer 214 may include a metal material different from a metal material of second conductive layer 212; third conductive layer 214 may include a metal oxide while second conductive layer 212 may include a metal; third conductive layer 214 may include a mixture of metal oxide and metal while second conductive layer 212 may include a metal. As another examples, third conductive layer 214 may consist of a metal material different from a metal material of second conductive layer 212; third conductive layer 214 may consist of a metal oxide while second conductive layer 212 may consist of a metal; third conductive layer 214 may consist of a metal oxide (or oxides) and a metal (metals) while second conductive layer 212 may consist of a metal (metals). As yet another example, third conductive layer 214 may be transparent (e.g., a metal oxide) and second conductive layer 212 may be reflective (e.g., a metal), or vice versa. As a further example, the materials of third conductive layer 214 may be selected to match a display medium layer (e.g., OLED layers) disposed on top in pixel electrode regions for a better carrier injection.

Figure 6B:
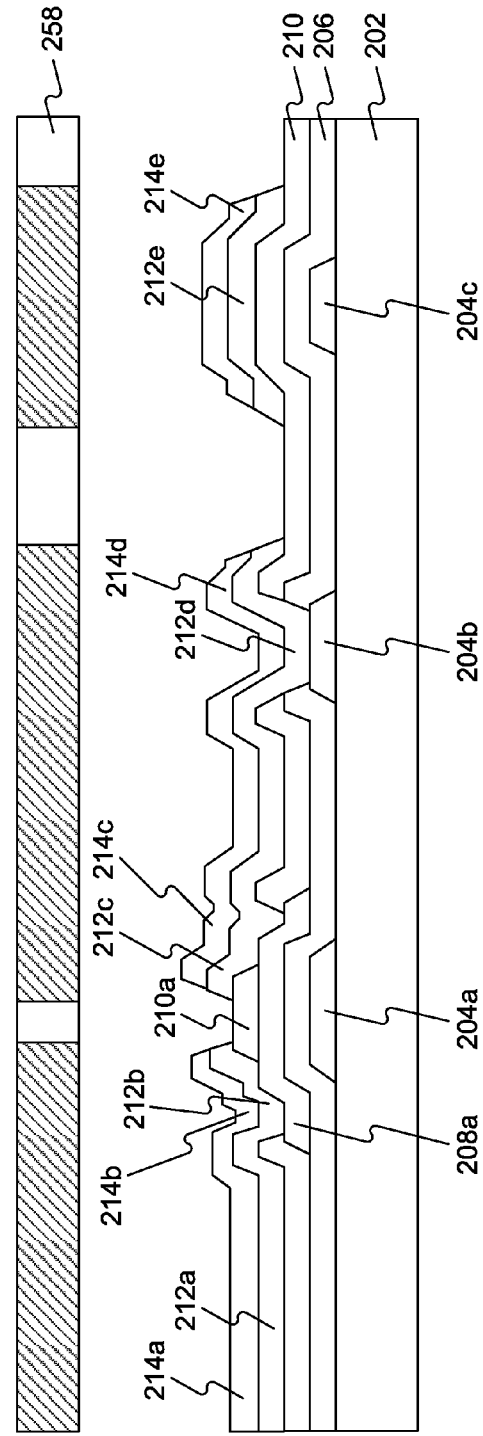

Referring to FIG. 6B, second conductive layer 212 and third conductive layer 214 are then patterned with fourth mask 258 to form a pixel electrode portion 212a, 214a; a source electrode portion 212b, 214b; a drain electrode portion 212c, 214c; an interconnection portion 212d, 214d; and a second electrode 212e, 214e. Pixel electrode portion 212a, 214a is arranged to extend to and connect source electrode portion 212b, 214b. Interconnection portion 212d, 214d is arranged to extend to and connect drain electrode portion 212c, 214c. However, the arrangements of these portions are not limited to these configurations. For example, in some embodiments, interconnection portion 212d, 214d and drain electrode portion 212c, 214c may be separated from each other or coupled to each other through another wiring pattern (not shown). Third conductive layer 214 is patterned so that all of its patterns are substantially aligned with the patterns of second conductive layer 212, in a one-to-one manner. However, in some embodiments, due to the etching process, the edges of the patterns of second conductive layer 212 and third conductive layer 214 may be offset from each other. Accordingly, a TFT device having three conductive layers may be formed with four masks.

In other embodiments, second conductive layer 212 and third conductive layer 214 may be patterned with a gray-tone or half-tone mask. An exemplary half-tone mask is shown in FIG. 6C. Referring to FIG. 6C, mask 260 includes three areas: area 260a having the lowest light transmission rate, area 260b having the highest light transmission rate, and area 260c having light transmission rate between those of areas 260a and 206b. After third conductive layer 214 is deposited on second conductive layer 212, a photoresist is coated on third conductive layer 214 similar to photoresist depicted in FIG. 5G. The photoresist is then exposed with light through mask 260 and subjected to a developing process. Referring to FIG. 6C, after being developed, photoresist layers 261a, 261b, and 261c are formed. Specifically, photoresist layer 261a under mask area 260a has the greatest thickness as it receives less light exposure. Photoresist layer under mask area 260b is removed from the surface of third conductive layer 214 in the developing process as it is thoroughly exposed with light. Photoresist layer 261c under mask area 260c has a thickness less than the thickness of photoresist layer 261a for it receives light exposure less than photoresist layer 261a does.

Second conductive layer 212 and third conductive layer 214 are then etched with photoresist layers 261a and 261c. Referring to FIG. 6D, after etching step, regions under photoresist layer 261a are protected so that both second conductive layer 212 and third conductive layer 214 remain, forming pixel electrode portion 212a, 214a, and source electrode portion 212b, 214b. Regions under photoresist layer 261c are partially protected so that only second conductive layer 212 remains, forming drain electrode portion 212c, interconnection portion 212d, and second electrode portion 212e. Regions of second conductive layer 212 and third conductive layer 214 not covered with a photoresist layer are etched to form an opening separating source electrode portion 212b, 214b and drain electrode portion 212c, and an opening separating interconnection portion 212d and second electrode portion 212e. The selection of materials for second conductive layer 212 and third conductive layer 214 in FIGS. 6C and 6D are similar to those in FIGS. 6A and 6B and thus is omitted here. Accordingly, a TFT device having three conductive layers may be formed with four masks.

Figure 7A:
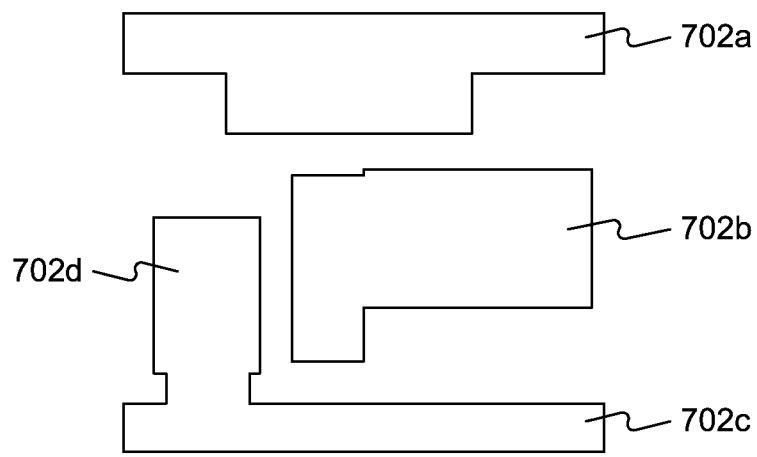
FIGS. 7A-7D depict exemplary methods of forming TFT devices consistent with some embodiments of this disclosure.
Figure 7B:
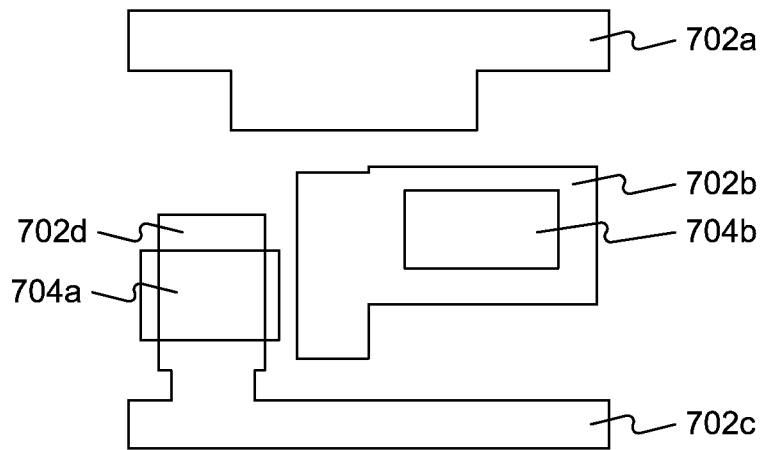

FIGS. 7A-7D depict exemplary pixel layouts of this disclosure. A first conductive layer is deposited on a substrate, similar to those depicted in FIG. 5B. FIG. 7A shows exemplary patterns of the first conductive layer after being patterned with a first mask. For example, the patterns of the first conductive layer include a first row/gate line 702a, a pad region 702b, a second row/gate line 702c, and a gate electrode region 702d coupled to second row line 702c. A first dielectric layer and a semiconductor layer are subsequently deposited on the substrate to cover the patterns of the first conductive layer, similar to those depicted in FIG. 5E. FIG. 7B depicts exemplary patterns of a semiconductor layer after being patterned with a second mask. For example, the patterns of the semiconductor layer include a first semiconductor island 704a and a second semiconductor island 704b.

Figure 7C:
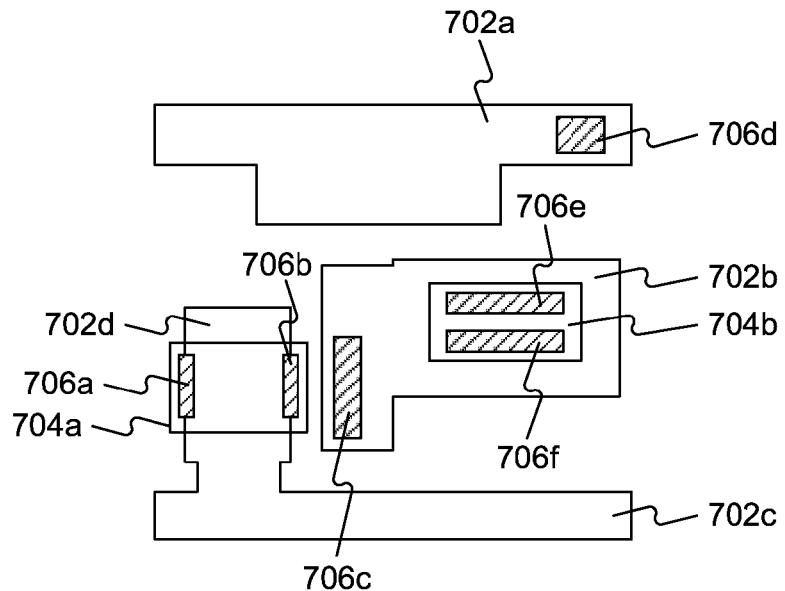

A second dielectric layer is then deposited on the substrate to cover semiconductor islands 704a, 704b, and the first dielectric layer. FIG. 7C depicts exemplary patterns of the first and second dielectric layers after being patterned with a third mask. For example, the patterns of the dielectric layers include first and second openings 706a, 706b in the second dielectric layer to reach first semiconductor island 704a; third and fourth openings in both the first and second dielectric layers to reach pad region 702b and first row line 702a, respectively; and fifth and sixth openings 706e, 706f in the second dielectric layer to reach second semiconductor island 704b. As a result, openings 706a and 706b expose surfaces of first semiconductor island 704a; opening 706c exposes a surface of pad region 702b; opening 706d exposes a surface of first row line 702a; openings 706e and 706f expose surfaces of second semiconductor island 704b.

Figure 7D:
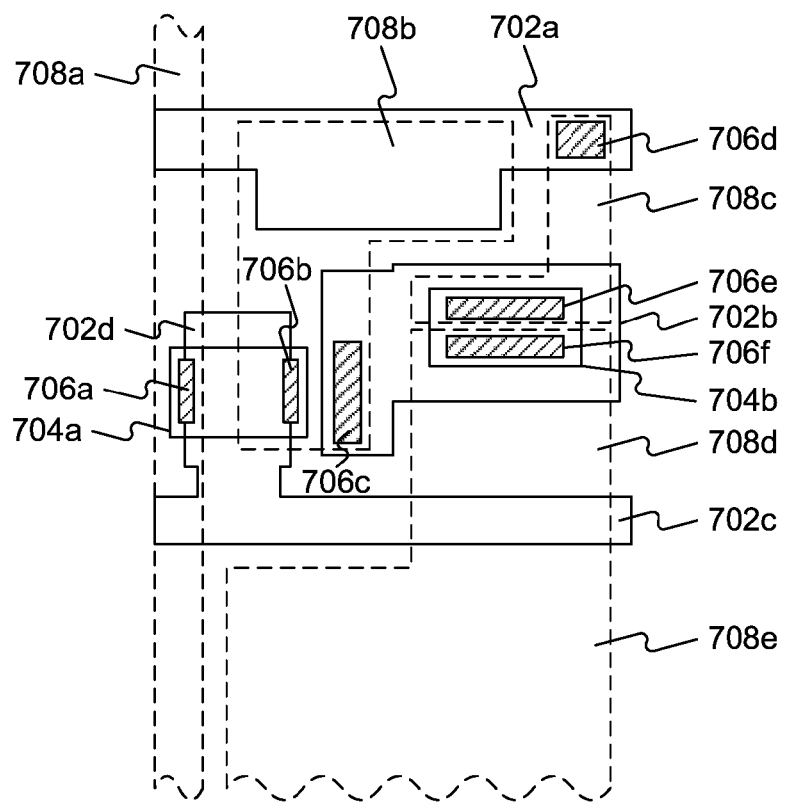

A second conductive layer is subsequently deposited on the substrate, similar to those depicted in FIG. 5J. FIG. 7D depicts exemplary patterns of the second conductive after being patterned with a fourth mask. For example, the patterns of the second conductive layer include a column/data line 708a, pad regions 708b, 708c, 708d, and a pixel electrode portion 708e. Column line 708a covers first opening 706a and connects to first semiconductor island 704a. Pad region 708b covers second opening 706b and third opening 706c, and connects to first semiconductor island 704a and pad region 702b of the first conductive layer. In addition, pad region 708b overlaps a portion of first row line 702a so as to form a capacitor. Pad region 708c covers fourth opening 706d and fifth opening 706e and connects to first row line 702a and second semiconductor island 704b. Pad region 708d covers sixth opening 706f and extends to pixel electrode portion 708e. Accordingly, a TFT device having two conductive layers may be formed with four masks.

In some embodiments, column line 708a, pad regions 708b, 708c, 708d, and pixel electrode portion 708e may contain two conductive layers having different materials, similar to those depicted in FIG. 6B. As such, a TFT device having three conductive layers may also be formed with four masks.

In other embodiments, some of column line 708a, pad regions 708b, 708c, 708d, and pixel electrode portion 708e may contain two conductive layers while others contain one conductive layer, similar to those depicted in FIG. 6D. For example, referring to FIG. 7, pad region 708d and pixel electrode portion 708e contain two different conductive layers while column line 708a and pad regions 708b, 708c contain a single conductive layer. As discussed above in connection with FIG. 6C, such configuration may also be formed using four masks including a half-tone mask.

Figure 8A:
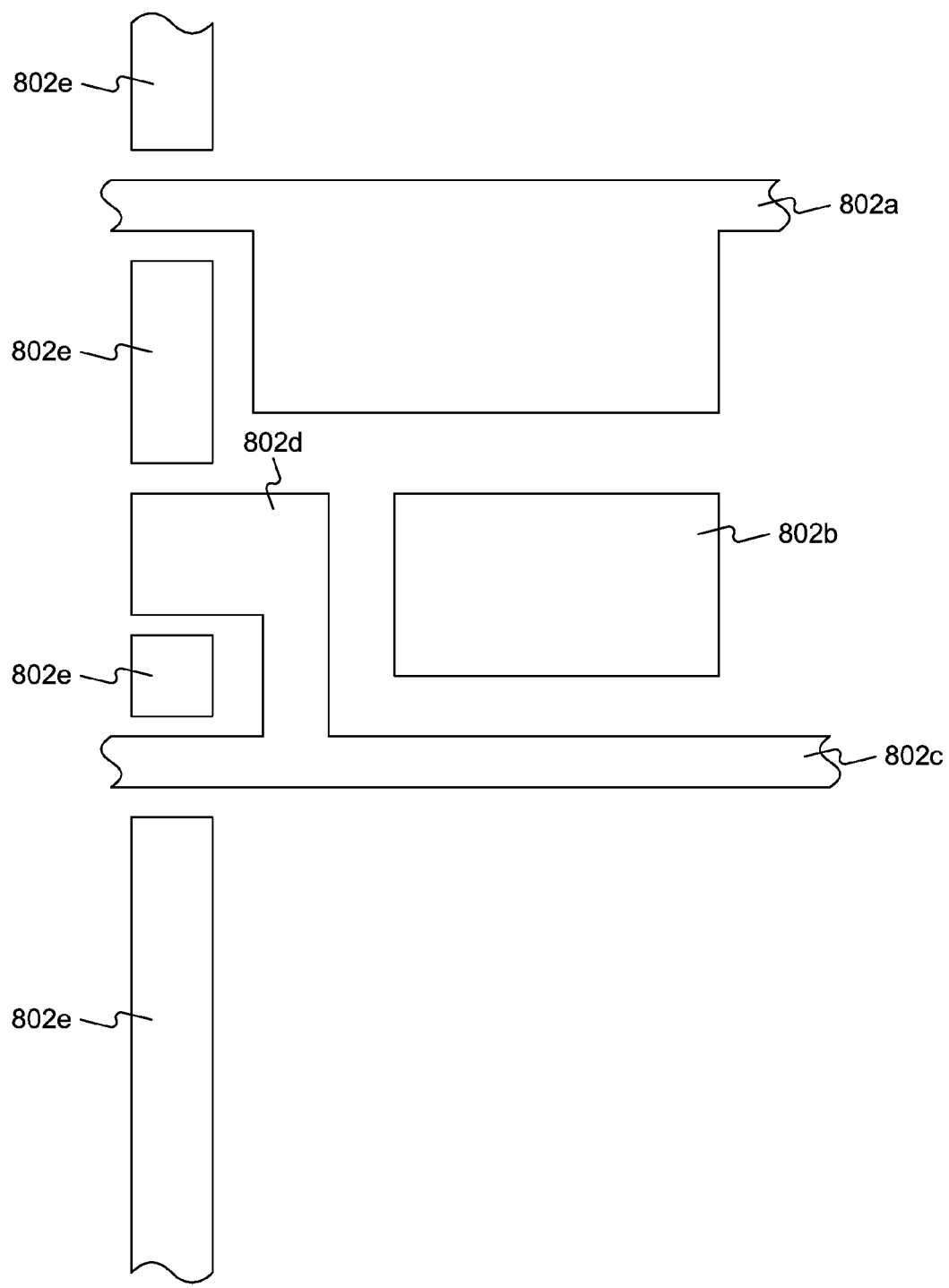
FIGS. 8A-8D depict exemplary methods of forming TFT devices consistent with some embodiments of this disclosure.
Figure 8B:
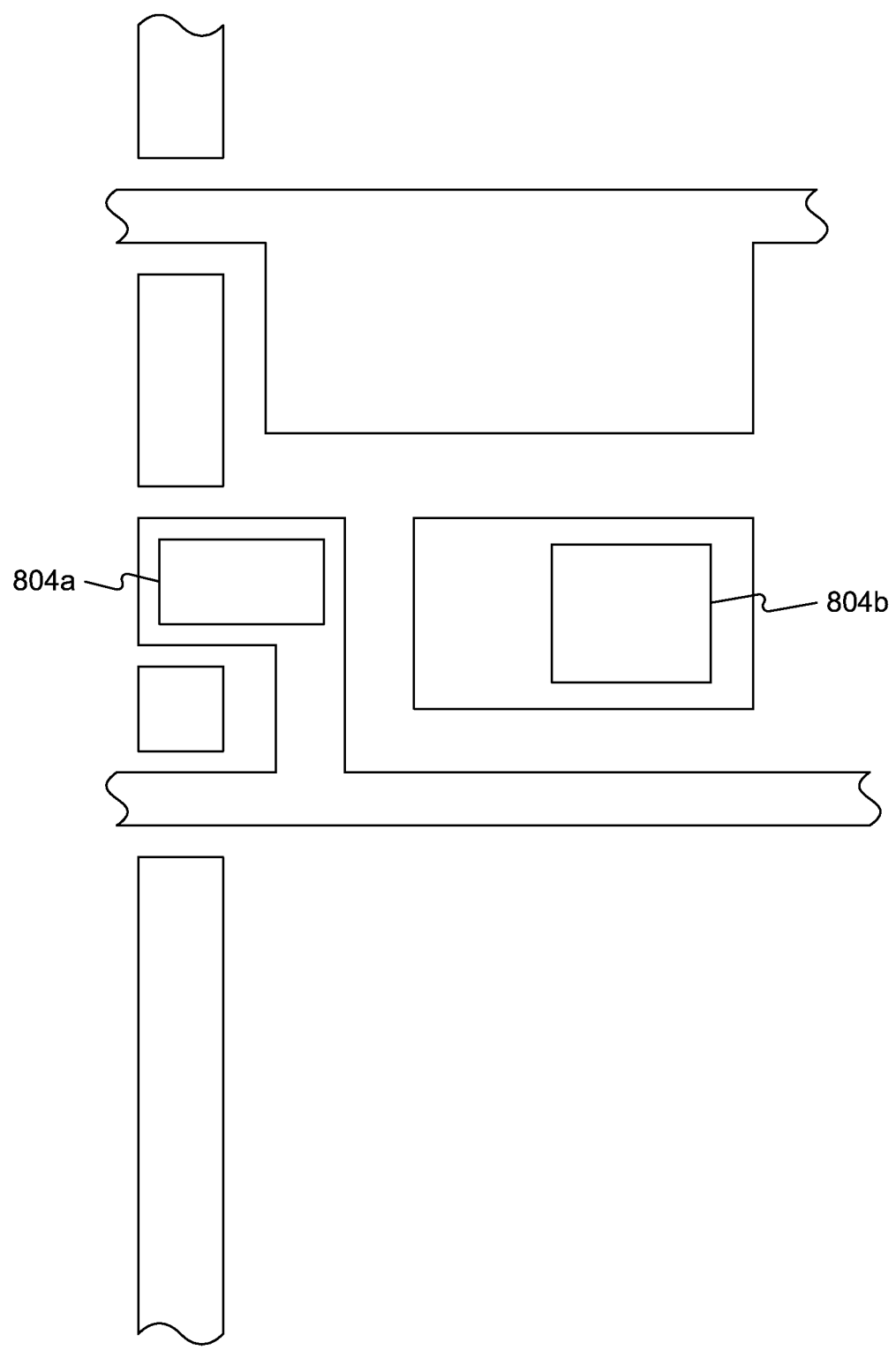

In some embodiments, first conductive layer may form part of both row and column lines. Exemplary pixel layouts are depicted in FIGS. 8A-8D. As described above, a first conductive layer is deposited on a substrate, similar to those depicted in FIG. 5B. FIG. 8A shows exemplary patterns of the first conductive layer after being patterned with a first mask. For example, the patterns of the first conductive layer include a first row line 802a, a pad region 802b, a second row line 802c, a gate electrode region 802d, and a plurality of line segments (connection pads) 802e extending in the column direction. Line segments 802e do not intersect row lines 802a and 802c. Subsequently, a first dielectric layer and a semiconductor layer are deposited on the substrate to cover the patterns of the first conductive layer, similar to those depicted in FIG. 5E. FIG. 8B depicts exemplary patterns of a semiconductor layer after being patterned with a second mask. For example, the patterns of the semiconductor layer include a first semiconductor island 804a and a second semiconductor island 804b.

Figure 8C:
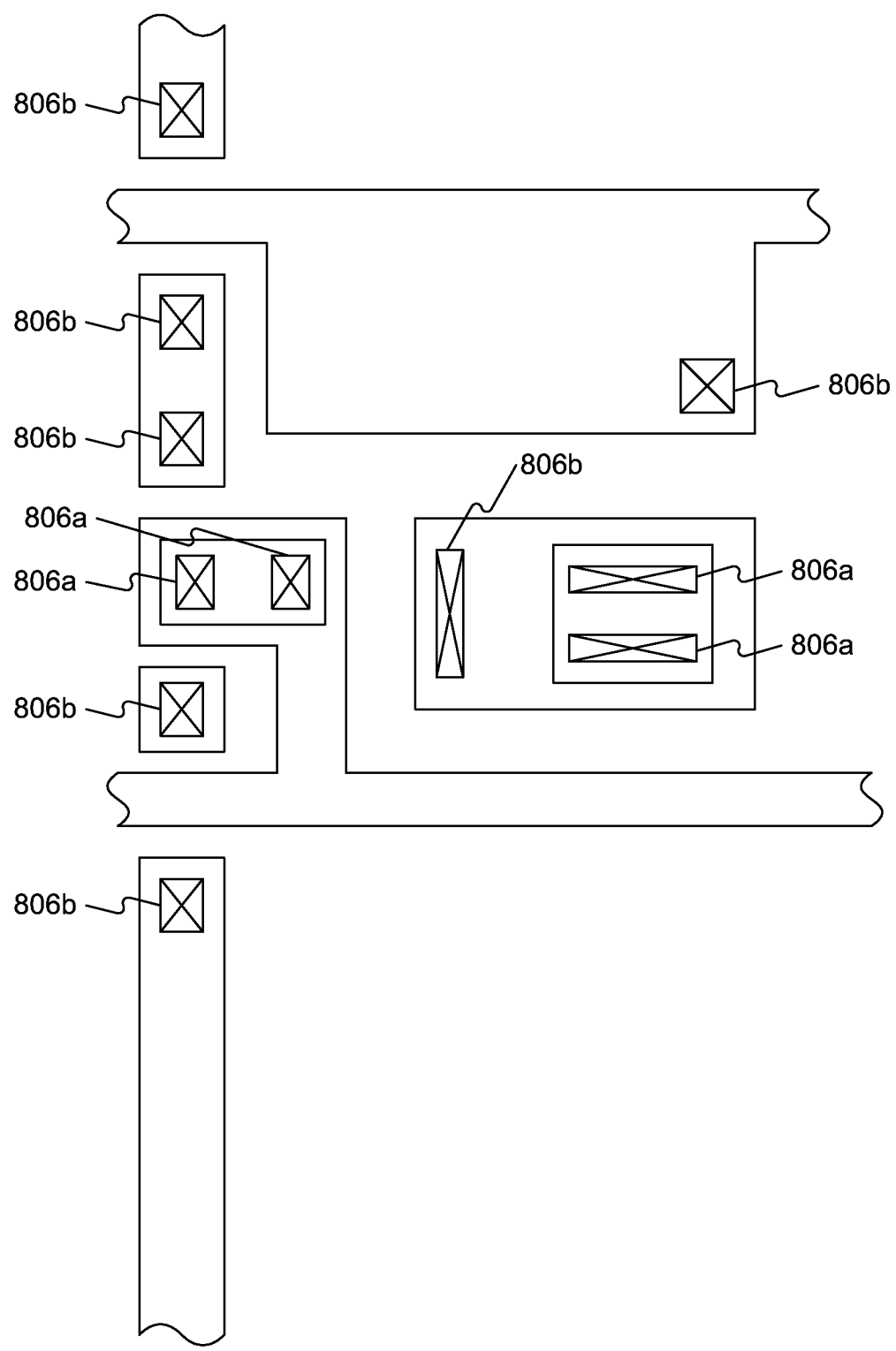

A second dielectric layer is then deposited on the substrate to cover semiconductor islands 804a, 804b, and the first dielectric layer. FIG. 8C depicts exemplary patterns of the first and second dielectric layers after being patterned with a third mask. For example, the patterns of the dielectric layers include first openings 806a in the second dielectric layer to reach semiconductor islands 804a, 804b, and second openings 806b in both the first and second dielectric layers to reach the first conductive layer. As a result, first openings 806a expose surfaces of first semiconductor island 804a and second semiconductor island 804b, and second openings 806b expose surfaces of a first row line 802a, a pad region 802b, and line segments 802e. Particularly, at least one opening 806b is arranged on each of line segments 802e.

Figure 8D:
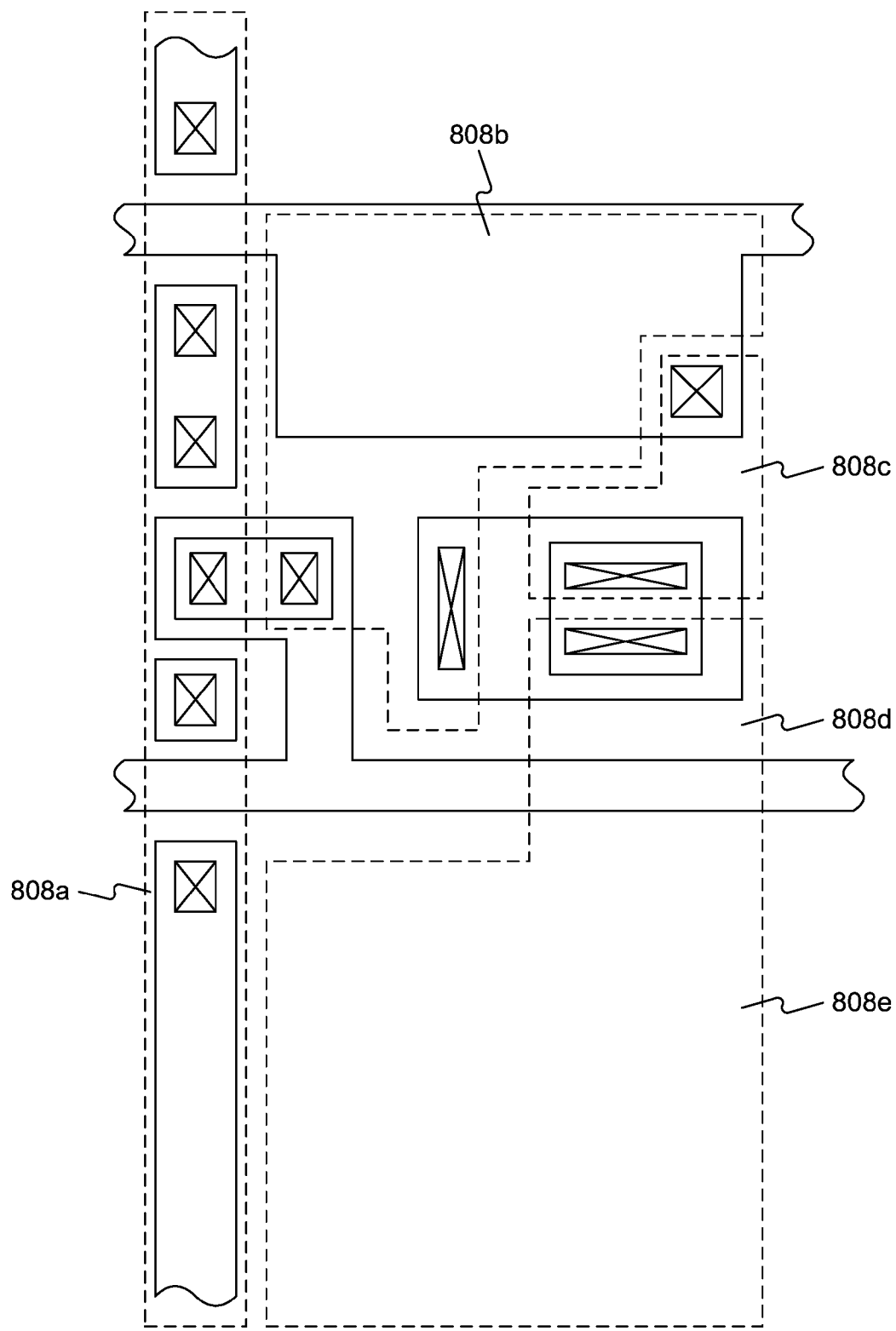

A second conductive layer is subsequently deposited on the substrate, similar to those depicted in FIG. 5J. FIG. 8D depicts exemplary patterns of the second conductive after being patterned with a fourth mask. For example, the patterns of the second conductive layer include a column line 808a, pad regions 808b, 808c, 808d, and a pixel electrode portion 808e. Column line 808a covers second openings 806b on line segments 802e and first opening 806a so as to connect to first semiconductor island 804a. Pad region 808b covers a first opening 806a and a second opening 806b over on pad region 802b so as to connect first semiconductor island 804a and pad region 802b of the first conductive layer. In addition, pad region 808b overlaps a portion of first row line 802a so as to form a capacitor. Pad region 808c covers a first opening 808a on second semiconductor island 804b and covers a second opening 806b on first row line 802a so as to connect first row line 802a and second semiconductor island 804b. Pad region 808d covers a first opening 806a on second semiconductor island 804b and extends to pixel electrode portion 808e.

As shown in FIG. 8D, lines run in the column direction (e.g., data lines) include two conductive layers and thus may have a lower resistance to reduce single delay in the column lines. A TFT device having such configuration may also be formed with four masks.

Figure 9:
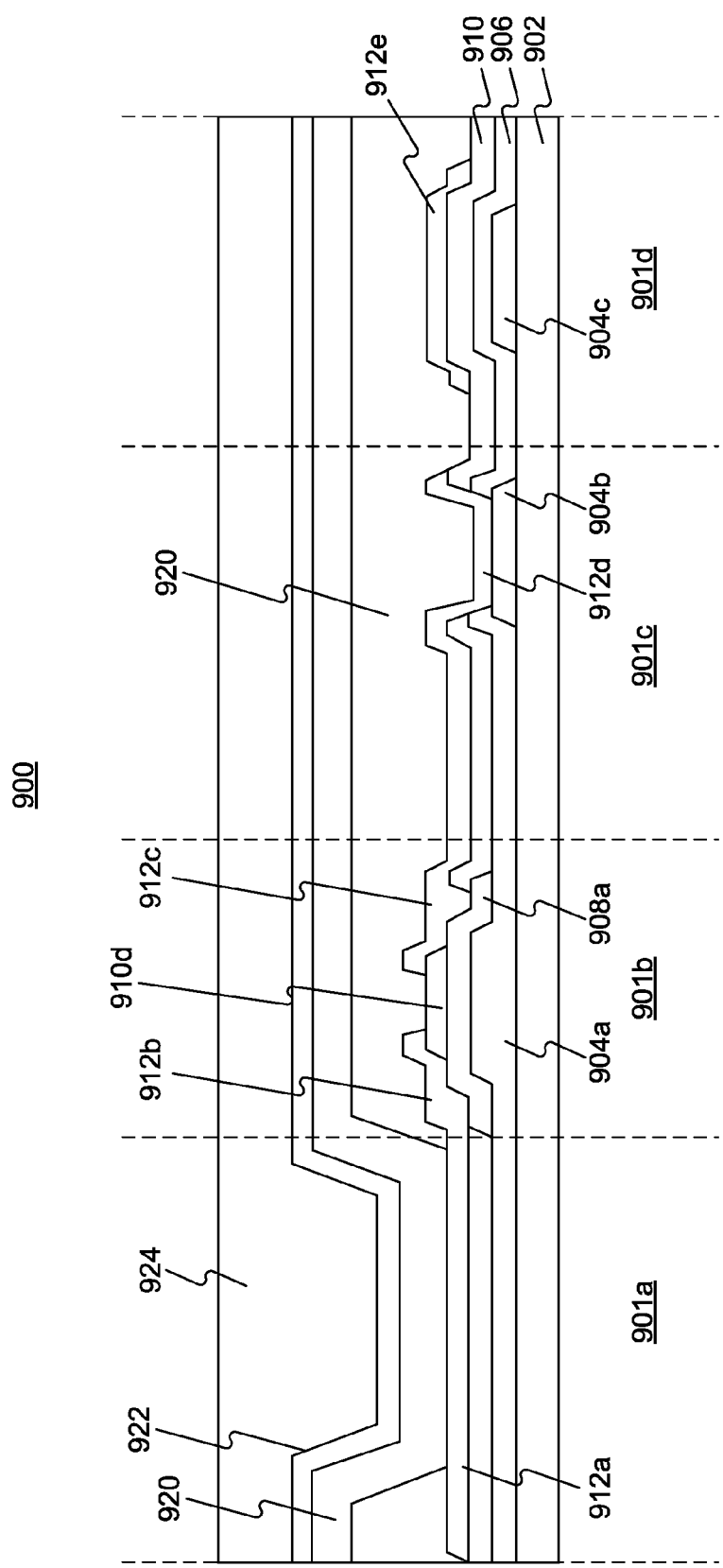
FIG. 9 shows an exemplary active matrix organic light-emitting diode device consistent with some embodiments of this disclosure.

The TFT devices disclosed above may be employed in various electronic devices. For example, the TFT devices may be used in display devices, such as AMOLED devices and liquid crystal display devices. FIG. 9 shows an AMOLED device having a TFT device. Referring to FIG. 9, AMOLED device 900 includes a light-emitting region 901a, a TFT device region 901b, an interconnection region 901c, and a thin film capacitor region 901d formed on a substrate 902. Substrate 902 may be made of glass, silicon, stainless steel, or polymer. The polymer substrate may be made of polyimide (PI), polyethylene naphthalate (PEN), polyethylene terephthalate (PET), polystyrene (PS), polyethersulfone (PES), polyethylene (PE), polyvinyl chloride (PVC), etc.

AMOLED device 900 includes a first conductive layer 904 formed on substrate 902, a first dielectric layer 906, a semiconductor layer 908, a second dielectric layer 910, and a second conductive layer 912. In some embodiments, a buffer layer is formed on substrate 902 before depositing the first conductive layer on substrate 902.

First conductive layer 904 includes a gate electrode 904a of TFT device region 901b, a connection pad 904b for interconnection region 901c, and a first electrode 904c for capacitor region 901d. First conductive layer 904 may be a metal (Al, Cu, Mo, Ti, Ni, W, Au, Pd, Pt, Cr, Nd, Zn, Co, Mn, or Ag), a conducting metal oxide (an oxide of In, Zn, Sn, Ga, Al, As, Cd, Hg, Tl, Pb, Ag, Au, Ge, Sb, Bi, Hf, Zr, etc., such as ITO, IZO, AZO, GZO, $In_2O_3$, or ZnO), or the mixture or multilayers or any combination of the above materials.

Referring to FIG. 9, first dielectric layer 906 covers gate electrode 904a and first electrode 904c, but does not completely cover connection pad 904b so as to expose at least a portion of connection pad 904b from first dielectric layer 906. First dialectic layer 906 may be made of $SiO_x$, $SiN_x$, $SiO_xN_y$, $AlO_x$, $Y_2O_3$, $HfO_x$, $ZrO_x$, AlN, AlNO, $TiO_x$, $BaTiO_3$, $PbTiO_3$, polymer, SOG, SOD, etc. or the mixture or multilayers or combination of the above materials.

Semiconductor layer 908a is formed on dielectric layer 906 and is disposed to overlap gate electrode 904a. In some embodiments, semiconductor layer 908a may have a width greater than that of gate electrode 901a. Semiconductor layer 908 may be made of amorphous silicon (a-Si) or a metal oxide, such as an oxide of In, Zn, Sn, Ga, Al, As, Cd, Hg, Tl, Pb, Ag, Au, Ge, Sb, Bi, Hf, Zr, etc.

Second dielectric layer 910 is disposed on semiconductor layer 908a and first dielectric layer 906. Second dielectric layer 910 includes a dielectric island 910a that overlaps a portion of semiconductor layer 908a. Second dielectric layer 910 has openings to expose connection pad 904b and first and second portions of semiconductor layer 908a on two sides of dielectric island 910a. Referring to FIG. 9, a portion of second dielectric layer 910 is disposed to cover first electrode 904c. In some embodiments, one of first dielectric layer 906 or second dielectric layer 910 on first electrode 904c may be omitted. Second dialectic layer 910 may be made of $SiO_x$, $SiN_x$, $SiO_xN_y$, $AlO_x$, $Y_2O_3$, $HfO_x$, $ZrO_x$, AlN, AlNO, $TiO_x$, $BaTiO_3$, $PbTiO_3$, polymer, SOG, SOD, etc. or the mixture or multilayers or combination of the above materials.

Referring again to FIG. 9, second conductive layer 912 is disposed on substrate 902. Second conductive layer 912 includes a pixel electrode portion 912a on the dielectric layer, a source electrode portion 912b disposed on and covering one portion of the exposed semiconductor layer, a drain electrode portion 912c disposed on and covering another portion of the exposed semiconductor layer, an interconnection portion 912d disposed on connection pad 204b, and a second electrode 912e disposed in capacitor region 901d. As shown in FIG. 9, pixel electrode portion 912a extends to source electrode portion 912b. Similarly, interconnection portion 912d extends to drain electrode portion 912c. Second electrode 912e, first electrode 904c, and first and second dielectric layers forms a capacitor.

In some embodiments, second conductive layer 912 can be a metal layer having a material selected from Al, Cu, Mo, Ti, Ni, W, Au, Pd, Pt, Cr, Nd, Zn, Co, Mn, Ag, etc., or the mixture or multilayer or combination of the above materials. Second conductive layer 912 can be a transparent conductor having a metal oxide material selected from an oxide of In, Zn, Sn, Ga, Al, As, Cd, Hg, Tl, Pb, Ag, Au, Ge, Sb, Bi, Hf, Zr, etc., such as ITO, IZO, AZO, GZO, $In_2O_3$, ZnO, etc., or the mixture or multilayer or combination of the above materials. In other embodiments, second conductive layer 912 may include a mixture of metal and metal oxide. For example, second conductive layer 212 can include one metal material (e.g., Zn) and one metal oxide material (e.g., ZnO) selected from the above materials.

AMOLED device 900 further includes a pixel defining layer 918, an OLED layer 920, an OLED cathode layer 922, and an encapsulation 924. Pixel defining layer 918 is disposed in regions other than where pixel electrode 912a is located. OLED layer 920 is disposed on pixel electrode 912a and on pixel defining layer 918. Pixel electrode 912a and OLED cathode layer 922 sandwiches OLED layer 920 to provide currents to OLED layer 920. Encapsulation 924 is disposed on OLED cathode layer 922 to protect the underlying layers.

Although explanatory embodiments have been shown and described, it would be appreciated by those skilled in the art that the above embodiments cannot be construed to limit the present disclosure, and changes, alternatives, and modifications can be made in the embodiments without departing from spirit, principles and scope of the present disclosure.

What is claimed is:

1. A thin film transistor (TFT) device comprising:
   a pixel having a first TFT and a second TFT, the pixel including:
      a gate electrode of the first TFT, a gate electrode of the second TFT and a connection pad, wherein the gate electrode of the first TFT, the gate electrode of the second TFT and the connection pad are distinct remaining portions patterned from a first conductive layer;
      a first dielectric layer covering the gate electrode of the first TFT and the gate electrode of the second TFT, respectively, and including a first opening, the first opening configured to expose the connection pad from the first dielectric layer;
      a first semiconductor island and a second semiconductor island patterned from a semiconductor layer disposed on the first dielectric layer and overlapping the gate electrode of the first TFT and the gate electrode of the second TFT, respectively;
      a second dielectric layer disposed on the semiconductor layer and the first dielectric layer, the second dielectric layer including a second opening, a third opening, a fourth opening, a fifth opening and a sixth opening, wherein the fifth and sixth openings are configured to expose third and fourth portions of the first semiconductor island, and the second and third openings are configured to expose first and second portions of the second semiconductor island, respectively, and the fourth opening is aligned with the first opening and configured to expose the connection pad;
      a source electrode portion of the first TFT covering the third portion of the first semiconductor island via the fifth opening;
      a drain electrode portion of the first TFT covering the fourth portion of the first semiconductor island via the sixth opening;
      a source electrode portion of the second TFT covering the first portion of the second semiconductor island via the second opening;
      a pixel electrode portion of the pixel extending to the source electrode portion of the second TFT;
      a drain electrode portion of the second TFT covering the second portion of the second semiconductor island via the third opening; and
      an interconnection portion disposed on the connection pad via the first and fourth openings and extending to the drain electrode portion of the second TFT;

wherein the source electrode portion of the first TFT, the drain electrode portion of the first TFT, the source electrode portion of the second TFT, the pixel electrode portion of the pixel, the drain electrode portion of the second TFT and the interconnection portion are distinct remaining portions patterned from a second conductive layer disposed on the second dielectric layer, and the source electrode portion of the first TFT, the drain electrode portion of the first TFT, the source electrode portion of the second TFT, the pixel electrode portion of the pixel, the drain electrode portion of the second TFT and the interconnection portion are made of the same conductive material.

2. The device of claim 1, wherein the second conductive layer comprises a transparent conductor.

3. The device of claim 2, wherein the transparent conductor includes at least one metal oxide.

4. The device of claim 3, wherein the at least one metal oxide comprises an oxide of In, Zn, Sn, Ga, Al, As, Cd, Hg, Tl, Pb, Ag, Au, Ge, Sb, Bi, Hf, or Zr, or a combination thereof.

5. The device of claim 2, wherein the second conductive layer further comprises a metal.

6. The device of claim 1, further comprising a third conductive layer disposed on the second conductive layer, the third conductive layer being aligned with the second conductive layer.

7. The device of claim 6, wherein the third conductive layer is aligned with the second conductive layer in a one-to-one manner.

8. The device of claim 7, wherein the second conductive layer comprises a reflective material and the third conductive layer comprises a transparent material.

9. The device according to claim 6, wherein the third conductive layer is at least aligned with the source electrode portion and the pixel electrode portion of the second conductive layer.

10. The device of claim 9, wherein the second conductive layer comprises a reflective material and the third conductive layer comprises a transparent material.

11. The device of claim 1, wherein the first conductive layer further comprises a first electrode of a capacitor; and
the second conductive layer further comprises a second electrode of the capacitor, the second electrode being opposed to the first electrode, the second electrode and the first electrode sandwiching at least one of the first dielectric layer or the second dielectric layer.

12. The device of claim 1, wherein the semiconductor layer comprises a material selected from amorphous silicon, polysilicon, and an oxide of In, Zn, Sn, Ga, Al, As, Cd, Hg, Tl, Pb, Ag, Au, Ge, Sb, Bi, Hf, or Zr, or a combination thereof.

13. The device of claim 1, further comprising:
a third conductive layer disposed on and covering part of the second conductive layer, wherein the third conductive layer is configured to cover the source electrode portion and the pixel electrode portion.

14. A thin film transistor (TFT) device, comprising:
a pixel having a first TFT and a second TFT, the pixel including:
a first gate electrode of the first TFT and a second gate electrode of the second TFT, both the first and second gate electrodes being made from a first conductive layer, the second gate electrode of the second TFT further including a first pad region;
a first dielectric layer covering the first and second gate electrodes and configured to expose the first pad region of the second TFT from the first dielectric layer;
a first semiconductor island and a second semiconductor island that are made from a semiconductor layer disposed on the first dielectric layer, the first and second semiconductor islands overlapping the first and second gate electrodes, respectively;
a second dielectric layer disposed on the semiconductor layer and the first dielectric layer, the second dielectric layer including a plurality of openings that are configured to expose the first pad region, and respective first and second portions of each of the first and second semiconductor islands;
a source electrode portion of the second TFT, covering the corresponding first portion of the second semiconductor island overlapping the second gate electrode of the second TFT;
a pixel electrode portion of the pixel extending to the source electrode portion of the second TFT;
a drain electrode portion of the first TFT, covering the corresponding second portion of the first semiconductor island overlapping the first gate electrode of the first TFT; and
a first interconnection portion disposed on the first pad region of the second TFT and extending to the drain electrode portion of the first TFT;
wherein the source electrode portion of the second TFT, the pixel electrode portion, the drain electrode portion of the first TFT, and the first interconnection portion disposed on the first pad region of the second TFT are distinct remaining portions patterned from a second conductive layer disposed on the second dielectric layer, and the source electrode portion of the second TFT, the pixel electrode portion, the drain electrode portion of the first TFT, and the first interconnection portion disposed on the first pad region of the second TFT are made of the same conductive material.

15. The device of claim 14, further comprising:
a row line that is made from the first conductive layer and is distinct from the first and second gate electrodes;
wherein the second conductive layer further comprises:
a second pad region extended from the first interconnection portion and the drain electrode portion of the first TFT to overlap a portion of the row line.

16. The device of claim 14, further comprising:
a row line that is made from the first conductive layer and is distinct from the first and second gate electrodes, wherein the first and second dielectric layers are configured to expose part of the row line
wherein the second conductive layer further comprises:
a drain electrode portion of the second TFT, covering the corresponding second portion of the second semiconductor island; and
a second interconnection portion disposed on the exposed part of the row line and extending to the drain electrode portion of the second TFT, wherein the drain electrode portion of the second TFT and the second interconnection portion are distinct remaining portions patterned from the second conductive layer.

17. A thin film transistor (TFT) device, comprising:
a pixel having a first TFT and a second TFT, the pixel including:
a gate electrode of the first TFT, a gate electrode of the second TFT and a row line that are made from a first conductive layer, wherein the row line, the gate electrode of the second TFT and the gate electrode of the first TFT are distinct remaining portions patterned from the first conductive layer;

a first dielectric layer covering the gate electrode of the first TFT, the gate electrode of the second TFT, and the row line, the first dielectric layer including a first opening, the first opening configured to expose the row line from the first dielectric layer;

a first semiconductor island and a second semiconductor island patterned from a semiconductor layer disposed on the first dielectric layer and overlapping the gate electrode of the first TFT and the gate electrode of the second TFT, respectively;

a second dielectric layer disposed on the semiconductor layer and the first dielectric layer, the second dielectric layer including a plurality of openings that are configured to expose third and fourth portions of the first semiconductor island, and first and second portions of the second semiconductor island and part of the row line exposed via the first opening of the first dielectric layer;

a source electrode portion of the first TFT covering the third portion of the first semiconductor island via a corresponding one of the plurality of openings;

a drain electrode portion of the first TFT covering the fourth portion of the first semiconductor island via a corresponding one of the plurality of openings;

a source electrode portion of the second TFT, covering the first portion of the second semiconductor island via a corresponding one of the plurality of openings;

a pixel electrode portion of the pixel extending to the source electrode of the second TFT;

a drain electrode portion of the second TFT, covering the second portion of the second semiconductor island via a corresponding one of the plurality of openings; and an interconnection portion disposed on the row line and extending to the drain electrode portion of the second TFT;

wherein the source electrode portion of the first TFT, the drain electrode portion of the first TFT, the source electrode portion of the second TFT, the pixel electrode portion of the pixel, the drain electrode portion of the second TFT, and the interconnection portion are distinct remaining portions patterned from a second conductive layer, and the source electrode portion of the first TFT, the drain electrode portion of the first TFT, the source electrode portion of the second TFT, the pixel electrode portion of the pixel, the drain electrode portion of the second TFT, and the interconnection portion are made of the same conductive material.

* * * * *